United States Patent
Hirosaki et al.

(10) Patent No.: US 7,540,977 B2
(45) Date of Patent: Jun. 2, 2009

(54) PHOSPHOR, PRODUCTION METHOD THEREOF AND LIGHT EMITTING INSTRUMENT

(75) Inventors: Naoto Hirosaki, Tsukuba (JP); Rong-Jun Xie, Tsukuba (JP)

(73) Assignee: National Institute for Materials Science, Tsukuba-shi, Ibaraki (JP)

( * ) Notice: Subject to any disclaimer, the term of this patent is extended or adjusted under 35 U.S.C. 154(b) by 251 days.

(21) Appl. No.: 11/663,449

(22) PCT Filed: Sep. 16, 2005

(86) PCT No.: PCT/JP2005/017546

§ 371 (c)(1),
(2), (4) Date: Mar. 22, 2007

(87) PCT Pub. No.: WO2006/033418

PCT Pub. Date: Mar. 30, 2006

(65) Prior Publication Data

US 2008/0143246 A1    Jun. 19, 2008

(30) Foreign Application Priority Data

Sep. 22, 2004    (JP)    ............................. 2004-274781

(51) Int. Cl.
*C09K 11/59* (2006.01)
*C09K 11/08* (2006.01)
*C09K 11/64* (2006.01)
*H01J 29/20* (2006.01)
*H01J 11/02* (2006.01)
*H01J 31/12* (2006.01)

(52) U.S. Cl. .............................. 252/301.4 F; 313/467; 313/486; 313/503; 257/98

(58) Field of Classification Search ........... 252/301.4 F; 257/98; 313/467, 486, 503
See application file for complete search history.

(56) References Cited

U.S. PATENT DOCUMENTS

2008/0029776 A1 * 2/2008 Shioi ........................ 257/98

2008/0296596 A1 * 12/2008 Setlur et al. .................... 257/98

FOREIGN PATENT DOCUMENTS

JP    2004-027022    1/2004
JP    2004-189996    7/2004

(Continued)

OTHER PUBLICATIONS

Derwent acc No. 2007-546758, 2008, abstract for DE 102005059521, WO2007068592 and EP 1966345.*
*Primary Examiner*—C. Melissa Koslow
(74) *Attorney, Agent, or Firm*—Manabu Kanesaka

(57) ABSTRACT

The present invention aims at providing a chemically stabilized inorganic phosphor, among oxynitride phosphors including alkaline earths, which oxynitride phosphor emits orange or red light at longer wavelengths at higher luminance than conventional sialon phosphors activated by rare earths. The present invention further aims at providing a light emitting instrument based on the phosphor, for a lighting instrument excellent in color rendering property and for an image displaying apparatus excellent in durability.

The solving means resides in provision of a fundamental phosphor comprising:

a composition on a pseudo-ternary phase diagram including AO (A is one kind or two or more kinds of element(s) selected from Mg, Ca, Sr, and Ba; and AO is oxide of A), $Si_3N_4$, and $SiO_2$ as end members, respectively, and satisfying all of the following conditions:

in a composition formula, $pAO\text{-}qSi_3N_4\text{-}rSiO_2 (p+q+r=1)$, $0.1 \leq p \leq 0.95$    (1), $0.05 \leq q \leq 0.9$    (2), and $0 \leq r \leq 0.5$    (3), and at least a metallic element M (M is one kind or two or more kinds of element(s) selected from Mn, Ce, Nd, Sm, Eu, Tb, Dy, Ho, Er, Tm, and Yb) dissolved, in a solid state, in the composition.

20 Claims, 7 Drawing Sheets

FOREIGN PATENT DOCUMENTS

| | | |
|---|---|---|
| JP | 2004-189997 | 7/2004 |
| JP | 2004-210921 | 7/2004 |
| WO | WO 2004/027022 | 4/2004 |
| WO | WO 2004/030109 | 4/2004 |

* cited by examiner

PHOSPHOR, PRODUCTION METHOD THEREOF AND LIGHT EMITTING INSTRUMENT

TECHNICAL FIELD

The present invention relates to a phosphor mainly including an inorganic compound and a production method and usage thereof. More particularly, the usage relates to a light emitting instrument for a lighting instrument and for an image displaying apparatus, utilizing the nature possessed by the phosphor, i.e., the property to emit fluorescence at long wavelengths between 570 nm and 700 nm.

BACKGROUND ART

Phosphors have been utilized for vacuum fluorescent displays (VFD), field emission displays (FED), plasma display panels (PDP), cathode ray tubes (CRT), white light emitting diodes (LED), and the like. In all these usages, it is required to supply an energy to an applicable phosphor to thereby excite it so as to cause it to emit light, and the phosphor is excited by an excitation source having high energy such as vacuum ultraviolet light, ultraviolet light, electron beam, blue light, or the like, such that the phosphor is caused to emit visible light.

However, since phosphors are exposed to the aforementioned excitation sources to resultingly cause a problem of deteriorated luminance during long-term usage, thereby necessitating a phosphor which is free of luminance deterioration. As such, there has been proposed a sialon phosphor as a phosphor exhibiting less luminance deterioration, instead of the conventional silicate phosphor, phosphate phosphor, aluminate phosphor, sulfide phosphor, and the like.

The sialon phosphor is produced by a production process as generally described below. Firstly, there are mutually mixed silicon nitride ($Si_3N_4$), aluminum nitride (AlN), calcium carbonate ($CaCO_3$), and europium oxide ($Eu_2O_3$) at a predetermined molar ratio, followed by holding for 1 hour at a temperature of 1,700° C. in nitrogen at 1 atm (0.1 MPa), and firing by hot pressing for production (see Patent Document 1, for example).

It has been reported that α-sialon obtained by the process and activated by Eu ion is established into a phosphor which is excited by blue light at 450 to 500 nm and caused to emit yellow light at 550 to 600 nm. However, there have been demanded not only the phosphor which emits yellow light but also phosphors which emit orange light and red light, respectively, for usages such as white LED and plasma display each having an ultraviolet LED as an excitation source. Further, there have been demanded phosphors which emit orange light, red light, and the like, respectively, in a white LED having a blue LED as an excitation source, for an improved color rendering property.

As a phosphor which emits red light, there has been reported an inorganic substance ($Ba_{2-x}Eu_xSi_5N_8$; where x=0.14 to 1.16) obtained by activating a $Ba_2Si_5N_8$ crystal with Eu, in a scientific literature (see Non-patent Document 1) prior to filing of the present application. There has been further reported a phosphor including, as a host material, a ternary nitride of alkali metals and silicon at various compositions, $M_xSi_yN_z$ (M=Ca, Sr, Ba, Zn; where x, y, and z take various values, respectively), in the second chapter of a publication "On new rare-earth doped M-Si—Al—O—N materials" (see Non-patent Document 2). Similarly, there has been reported $M_xSi_yN_z$:Eu (M=Ca, Sr, Ba, Zn; where z=2/3x+4/3y), in U.S. Pat. No. 6,682,663 (Patent Document 2).

As other sialon phosphors, nitride phosphors, and oxynitride phosphors, there have been described phosphors including, as host crystals, $MSi_3N_5$, $M_2Si_4N_7$, $M_4Si_6N_{11}$, $M_9Si_{11}N_{23}$, $M_{16}Si_{15}O_6N_{32}$, $M_{13}Si_{18}Al_{12}O_{18}N_{36}$, $MSi_5Al_2ON_9$, and $M_3Si_5AlON_{10}$ (where M is Ba, Ca, Sr, or rare earth element) activated with Eu, Ce, or the like in JP-A-2003-206481 (Patent Document 3) and U.S. Pat. No. 6,670,748 (Patent Document 4), and there have been described therein a phosphor which emits red light and an LED lighting unit utilizing the phosphor.

Among them, $SrSiAl_2O_3N_2$:$Eu^{2+}$ and $Sr_2Si_4AlON_7$:$Eu^{2+}$ have been known as compounds based on $Eu_aSr_bSi_cAl_dO_eN_f$. Further, there has been reported a phosphor obtained by activating an $Sr_2Si_5N_8$ or $SrSi_7N_{10}$ crystal with Ce, in JP-A-2002-322474 (Patent Document 5).

In JP-A-2003-321675 (Patent Document 6), there have been found a description of a phosphor $L_xM_yN_{(2/3x+4/3y)}$:Z (L is a divalent element such as Ca, Sr, Ba, or the like, and M is a tetravalent element such as Si, Ge, or the like, and Z is an activator such as Eu), and a description that addition of a small amount of Al brings about an effect of restricting afterglow. Further, it has been known that a combination of the phosphor with a blue LED provides a light emitting apparatus for emitting warm color based and slightly reddish white light.

In turn, there has been reported a phosphor configured with various L elements, M elements, and Z elements, as an $L_xM_yN_{(2/3x+4/3y)}$:Z phosphor, in JP-A-2003-277746 (Patent Document 7). Meanwhile, although JP-A-2004-10786 (Patent Document 8) has described a wide variety of combinations concerning L-M-N:Eu, Z types, it has failed to show an effect of improved emission characteristics in case of adopting specific compositions or crystal phases as host materials.

Although the phosphors represented by those of the aforementioned Patent Documents 2 through 7 have been reported as ones including various different crystal phases as host materials while providing known phosphors for emitting red light, emission luminances of red light have been insufficient insofar as based on excitation by blue visible light. Further, the phosphors have been chemically unstable depending on compositions, thereby exhibiting a problem of durability. Moreover, there have been adopted metals such as Ca, Sr, and the like, or nitride, as starting materials, so that the applicable powder is required to be mixedly obtained in a state where air is to be shut off, thereby exhibiting a problem of productivity.

As the related art of lighting apparatus, there has been known a white light emitting diode based on a combination of a blue light emitting diode element with a blue-light absorbing/yellow-light emitting phosphor, which has been practiced in various lighting usages. Representative examples thereof include those described in JP-2900928 (Patent Document 9) entitled "Light Emitting Diode", JP-2927279 (Patent Document 10) entitled "Light Emitting Diode", JP-3364229 (Patent Document 11) entitled "Casting Material for Wavelength Conversion, Production Method Thereof, and Light Emitting Element", and the like.

The phosphors, which are particularly frequently utilized in these light emitting diodes, are yttrium/aluminum/garnet based phosphors represented by a general formula $(Y, Gd)_3(Al, Ga)_5O_{12}$:$Ce^{3+}$.

However, the white light emitting diode comprising the blue light emitting diode element and the yttrium/aluminum/garnet based phosphor has a feature to emit bluish white light due to lack of a red component, thereby problematically exhibiting deviation in a color rendering property.

Under such circumstances, there has been investigated a white light emitting diode including two kinds of mixed and dispersed phosphors, such that a red component lacking in case of a yttrium/aluminum/garnet based phosphor is compensated for by an additional red-aimed phosphor. Examples of such light emitting diodes include JP-A-10-163535 (Patent Document 12) entitled "White Light Emitting Element", JP-A-2003-321675 (Patent Document 6) entitled "Nitride Phosphor and Production Method Thereof", and the like. However, there have been still left problems to be improved concerning color rendering property even by these inventions, thereby necessitating a light emitting diode for solving such a problem. Further, the red-aimed phosphor described in JP-A-10-163535 (the Patent Document 12) includes cadmium, thereby exhibiting a problem of environmental pollution. Contrary, although the red-light emitting phosphors including $Ca_{1.97}Si_5N_8:Eu_{0.03}$ described in JP-A-2003-321675 (the Patent Document 6) as a representative example do not include cadmium, the phosphors are low in luminance, thereby still necessitating a further improvement of emission intensities thereof.

REFERENCED LITERATURE/PUBLICATION

Non-patent Document 1: H. A. Hoppe, and four others, "Journal of Physics and Chemistry of Solids", 2000, No. 61, pp. 2001-2006

Non-patent Document 2: "On new rare-earth doped M—Si—Al—O—N materials", written by J. W. H. van Krevel, T U Eindhoven 2000, ISBN 90-386-2711-4

Patent Document 1: JP-A-2002-363554
  Patent Document 2: U.S. Pat. No. 6,682,663
  Patent Document 3: JP-A-2003-206481
  Patent Document 4: U.S. Pat. No. 6,670,748
  Patent Document 5: JP-A-2002-322474
  Patent Document 6: JP-A-2003-321675
  Patent Document 7: JP-A-2003-277746
  Patent Document 8: JP-A-2004-10786
  Patent Document 9: JP-2900928
  Patent Document 10: JP-2927279
  Patent Document 11: JP-3364229
  Patent Document 12: JP-A-10-163535

DISCLOSURE OF THE INVENTION

Problem to be Solved by the Invention

The present invention intends to satisfy such a demand, and has an object to provide a chemically stabilized inorganic phosphor, among oxynitride phosphors including alkaline earths, which oxynitride phosphor emits orange or red light at longer wavelengths and at higher luminance than conventional sialon phosphors activated by rare earths.

It is another object of the present invention to provide a production method therefor suitable for industrial production, by adopting starting materials which are stable in the atmosphere. It is still another object of the present invention to provide a light emitting instrument utilizing such a phosphor, for a lighting instrument excellent in color rendering property and for an image displaying apparatus excellent in durability.

Means for Solving the Problem

Under these circumstances, the present inventors have specifically investigated phosphors including, as host materials, inorganic multi-component nitride crystals including (i) divalent alkaline earth elements (A) such as Mg, Ca, Sr, and Ba, and (ii) Si, both as main metallic elements, and have found that those phosphors allow for preparation of powders therefor in the atmosphere and emit fluorescence at higher luminance than the conventionally reported ones including, as host crystals, nitrides, oxynitrides, and the like, which phosphors by the present inventors include, as host materials, inorganic crystals having a specific composition based on $Si_3N_4$—$SiO_2$-AO, a specific composition based on $Si_2N_2O$-AO, or a specific composition based on $Si_3N_4$-AO, which is activated by photoactive metals such as Mn, Ce, Nd, Sm, Eu, Tb, Dy, Ho, Er, Tm, Yb, and the like.

Namely, the present inventors have earnestly and repeatedly investigated inorganic compounds mainly including oxynitrides containing: an M element (M is one kind or two or more kinds of element(s) selected from Mn, Ce, Pr, Nd, Sm, Eu, Gd, Tb, Dy, Ho, Er, Tm, and Yb) to be matured into a light emitting ion; a divalent A element (A is one kind or two or more kinds of element(s) selected from Mg, Ca, Sr, and Ba); Si; nitrogen; and oxygen; and have found that there can be obtained phosphors which emit orange or red light at higher luminance, each derived from a crystal of a specific composition represented by $M_aA_bSi_cO_dN_e$, and particularly based on an inorganic compound including $A_2Si_3O_2N_4$ crystal, $A_2Si_3O_2N_4$ solid solution crystal, $A_3Si_3O_3N_4$ crystal, $A_3Si_3O_3N_4$ solid solution crystal, $A_3Si_2O_4N_2$ crystal, or $A_3Si_2O_4N_2$ solid solution crystal, which is activated by an M element such as Eu.

Further, the present inventors have found that adoption of this phosphor allows for obtainment of a white light emitting diode having a higher light-emission efficiency and being excellent in color rendering property with a rich red component, and an image displaying apparatus for exhibiting brilliant red color.

The present inventors have also found that the host crystal of the phosphor according to the present invention includes a specific crystal represented by $M_aA_bSi_cO_dN_e$ as a host material to thereby achieve emission at a luminance which has never been provided up to now, unlike the ternary nitrides including divalent and tetravalent elements as represented by the conventionally reported $L_xM_yN_{(2/3x+4/3y)}$. Further, the present invention resides in a novel phosphor including, as a host material, a crystal having a composition and a crystal structure which are fully different from those of $M_{13}Si_{18}Al_{12}O_{18}N_{36}$, $MSi_5Al_2ON_9$, $M_3Si_5AlON_{10}$ (M is Ca, Ba, Sr, or the like), $SrSiAl_2O_3N_2:Eu^{2+}$, $Sr_2Si_4AlON_7:Eu^{2+}$ conventionally reported in the Patent Documents 3, 4, and the like, and the sialon such as $Ca_{1.47}Eu_{0.03}Si_9Al_3N_{16}$ described in the eleventh chapter of the Non-patent Document 2.

Generally, phosphors including inorganic host crystals activated with Mn or rare earth element as an emission center element M, exhibit light emission colors and luminances which vary depending on electronic states around the M element. For example, it has been reported that change of host crystals in phosphors each including Eu as an emission center leads to emission in blue, green, yellow, or red color.

Namely, even phosphors having similar compositions exhibit fully different light emission colors and luminances when crystal structures of the host materials or atom positions in the crystal structures for introducing M thereinto are changed, so that such phosphors are regarded as ones different from one another. The present invention has devised, as host materials, crystals which are fully different from the conventionally reported compositions of nitrides, oxynitrides, sialons, and the like, and any phosphors including such crystals as host materials have been never reported in the conventional.

Moreover, the phosphors including the compositions of the present invention as host materials, have luminances higher than those phosphors including conventional crystals as host materials, and exhibit red light emission at specific compositions.

The present inventors have earnestly and repetitively conducted investigation in view of the above-described actual situation, and have succeeded in providing phosphors which exhibit emission phenomena at higher luminances over specific wavelength ranges, respectively, by achieving configurations recited in the following items (1) through (29).

Further, the present inventors have succeeded in producing phosphors having excellent emission characteristics, by adopting the methods of items (30) through (45).

Moreover, the present inventors have also succeeded in providing a lighting instrument and an image displaying apparatus having excellent properties by using the phosphor and achieving configurations recited in items (46) through (55), and the above configurations are recited in the following items (1) through (55).

(1) A phosphor, characterized in that the phosphor includes, as a main component, an inorganic compound comprising:

a composition on a pseudo-ternary phase diagram including AO (A is one kind or two or more kinds of element(s) selected from Mg, Ca, Sr, and Ba; and AO is oxide of A), $Si_3N_4$, and $SiO_2$ as end members, respectively, and satisfying all of the following conditions:

in a composition formula, $pAO\text{-}qSi_3N_4\text{-}rSiO_2$ ($p+q+r=1$), $$0.1 \leq p \leq 0.95 \quad (1),$$

$$0.05 \leq q \leq 0.9 \quad (2), \text{ and}$$

$$0 \leq r \leq 0.5 \quad (3), \text{ and}$$

at least a metallic element M (M is one kind or two or more kinds of element(s) selected from Mn, Ce, Nd, Sm, Eu, Tb, Dy, Ho, Er, Tm, and Yb) dissolved, in a solid state, in the composition.

(2) The phosphor of item (1), characterized in that the composition on the pseudo-ternary phase diagram including AO, $Si_3N_4$, and $SiO_2$ as end members, respectively, is in a crystal phase.

(3) The phosphor of item (1) or (2), characterized in that the phosphor includes at least the metallic element M (M is one kind or two or more kinds of element(s) selected from Mn, Ce, Nd, Sm, Eu, Tb, Dy, Ho, Er, Tm, and Yb), a metallic element A, Si, oxygen, and nitrogen; and that the ratio among the elements M, A, O, Si, and N is represented by a composition formula $M_a A_b Si_c O_d N_e$ ($a+b+c+d+e=1$) which satisfies all of the following conditions:

$$0.00001 \leq a \leq 0.3 \quad (4),$$

$$d = (a+b) \times f \quad (5),$$

$$e = ((4/3) \times c) \times g \quad (6),$$

$$0.8 \leq f \leq 1.25 \quad (7), \text{ and}$$

$$0.8 \leq g \leq 1.25 \quad (8).$$

(4) The phosphor of item (3), characterized in that $f=1$ and $g=1$.

(5) The phosphor of item (3) or (4), characterized in that $c \leq 3b$.

(6) The phosphor of any one of items (1) through (5), characterized in that the phosphor includes, as the main component, an inorganic compound comprising:

a crystal represented by a composition formula $hSi_3N_4 + iAO$ ("h" and "i" are between 0 inclusive and 1 inclusive, and $0.2 \leq i/(h+i) \leq 0.95$), or a solid solution of the crystal; and the M element for activating the crystal or the solid solution of the crystal.

(7) The phosphor of any one of items (1) through (6), characterized in that the phosphor includes, as the main component, an inorganic compound comprising:

an $A_2Si_3O_2N_4$ crystal, or a solid solution crystal thereof; and the M element for activating the crystal or solid solution crystal.

(8) The phosphor of item (7), characterized in that the solid solution crystal of $A_2Si_3O_2N_4$ is $A_2Si_{3-x}Al_xO_{2+x}N_{4-x}$ ($0 \leq x \leq 0.5$).

(9) The phosphor of any one of items (1) through (6), characterized in that the phosphor includes, as the main component, an inorganic compound comprising:

an $A_3Si_3O_3N_4$ crystal, or a solid solution crystal thereof; and the M element for activating the crystal or solid solution crystal.

(10) The phosphor of item (9), characterized in that the solid solution crystal of $A_3Si_3O_3N_4$ is $A_3Si_{3-x}Al_xO_{3+x}N_{4-x}$ ($0 \leq x \leq 0.5$).

(11) The phosphor of item (1) or (2), characterized in that the phosphor includes at least the metallic element M (M is one kind or two or more kinds of element(s) selected from Mn, Ce, Nd, Sm, Eu, Tb, Dy, Ho, Er, Tm, and Yb), the metallic element A, Si, oxygen, and nitrogen; and that the ratio among the elements M, A, Si, O, and N is represented by a composition formula $M_a A_b Si_c O_d N_e$ ($a+b+c+d+e=1$), which satisfies all of the following conditions:

$$0.00001 \leq a \leq 0.03 \quad (9),$$

$$d = (a+b+(1/2) \times c) \times f \quad (10),$$

$$e = c \times g \quad (11),$$

$$0.8 \leq f \leq 1.25 \quad (12), \text{ and}$$

$$0.8 \leq g \leq 1.25 \quad (13).$$

(12) The phosphor of item (11), characterized in that $f=1$ and $g=1$.

(13) The phosphor of item (11) or (12), characterized in that $c \leq b$.

(14) The phosphor of any one of items (1), (2), and (11) through (13), characterized in that the phosphor includes, as the main component, an inorganic compound comprising:

a crystal represented by a composition formula $hSi_2N_2O + iAO$ ("h" and "i" are between 0 inclusive and 1 inclusive, and $0.2 \leq i/(h+i) \leq 0.95$), or a solid solution of the crystal; and the M element for activating the crystal or the solid solution of the crystal.

(15) The phosphor of any one of items (1), (2), and (11) through (14), characterized in that the phosphor includes, as the main component, an inorganic compound comprising:

an $A_3Si_2O_4N_2$ crystal, or a solid solution crystal thereof; and the M element for activating the crystal or solid solution crystal.

(16) The phosphor of item (15), characterized in that the solid solution crystal of $A_3Si_2O_4N_2$ is $A_3Si_{2-x}Al_xO_{4+x}N_{2-x}$ ($0 \leq x \leq 0.5$).

(17) The phosphor of any one of items (1) through (16), characterized in that the phosphor includes, as the main component, an inorganic compound comprising:

an $A_3Si_{3-y}O_{3+y}N_{4-2y}$ crystal ($0 \leqq y \leqq 1.8$), or a solid solution crystal thereof; and the M element for activating the crystal or solid solution crystal.

(18) The phosphor of any one of items (1) through (17), characterized in that the phosphor includes at least Eu in M.

(19) The phosphor of any one of items (1) through (18), characterized in that the phosphor includes at least Sr in A.

(20) The phosphor of any one of items (1) through (19), characterized in that M is Eu and A is Sr.

(21) The phosphor of any one of items (1) through (20), characterized in that A is a mixture of Ca and Sr.

(22) The phosphor of any one of items (1) through (20), characterized in that A is a mixture of Ba and Sr.

(23) The phosphor of any one of items (1) through (22), characterized in that the phosphor emits orange or red fluorescence at a wavelength between 570 nm inclusive and 700 nm inclusive, by irradiation of an excitation source comprising ultraviolet light, visible light, or electron beam.

(24) The phosphor of any one of items (1) through (23), characterized in that the phosphor emits fluorescence having a "y" value between 0.44 inclusive and 0.73 inclusive in terms of CIE chromaticity representation.

(25) The phosphor of any one of items (1) through (24), characterized in that the inorganic compound is a powder having an averaged particle size between 0.1 μm inclusive and 50 μm inclusive.

(26) A phosphor characterized in that the phosphor is constituted of a mixture of the inorganic compound of any one of items (1) through (25) and an additional crystal phase or amorphous phase; and that the inorganic compound of any one of items (1) through (25) is included at a content of 10 mass % or more.

(27) The phosphor of item (26), characterized in that the content of inorganic compound of any one of items (1) through (25) is 50 mass % or more.

(28) The phosphor of item (26) or (27), characterized in that the additional crystal phase or amorphous phase is an inorganic substance having electroconductivity.

(29) The phosphor of item (28), characterized in that the inorganic substance having electroconductivity is oxide, oxynitride, nitride, or a mixture thereof including one kind or two or more kinds of element(s) selected from Zn, Ga, In, and Sn.

(30) A production method of the phosphor of any one of items (1) through (29), characterized in that the method comprises the step of:

firing a starting material mixture in a nitrogen atmosphere at a temperature range between 1,200° C. inclusive and 2,200° C. inclusive, wherein the starting material mixture is a mixture of metallic compounds, and is capable of constituting a composition comprising M, A, Si, O, and N, and including Al as required (M is one kind or two or more kinds of element(s) selected from Mn, Ce, Nd, Sm, Eu, Tb, Dy, Ho, Er, Tm, and Yb; and A is one kind or two or more kinds of element(s) selected from Mg, Ca, Sr, and Ba).

(31) The production method of the phosphor of item (30), characterized in that the metallic compound mixture is a mixture of: a metal, oxide, carbonate, nitride, fluoride, chloride, or oxynitride of M; a metal, oxide, carbonate, nitride, fluoride, chloride, or oxynitride of A; silicon nitride; silicon oxide as required; aluminum nitride as required; and aluminum oxide as required.

(32) The production method of the phosphor of item (30) or (31), characterized in that the metallic compound mixture is obtained by mutually mixing: europium oxide; oxide or carbonate of A; silicon nitride; and silicon oxide as required; at a molar composition ratio (where the molar amount of A is calculated as oxide, in case of adopting carbonate of A) represented by:

$$pAO+qSi_3N_4+rSiO_2+sMO \tag{11}$$

where $p+q+r+s=1$, $$0.1 \leqq p+s \leqq 0.95 \tag{12},$$

$$0.05 \leqq q \leqq 0.9 \tag{13, and}$$

$$0 \leqq r \leqq 0.5 \tag{14}.$$

(33) The production method of the phosphor of item (32), characterized in that r=0.

(34) The production method of the phosphor of item (32), characterized in that q=r.

(35) The production method of the phosphor of any one of items (30) through (34), characterized in that the method further comprises the step of:

adding a flux compound for generating a liquid phase at the firing temperature, into the metallic compound mixture.

(36) The production method of the phosphor of item (35), characterized in that the flux compound is a compound selected from fluoride, chloride, and borate of the A element.

(37) The production method of the phosphor of any one of items (30) through (36), characterized in that the nitrogen atmosphere is a gas atmosphere at a pressure in a range between 0.1 MPa inclusive and 100 MPa inclusive.

(38) The production method of the phosphor of any one of items (30) through (37), characterized in that the method further comprises the step of:

firing the metallic compounds each in a form of powder or aggregation, after filling the metallic compounds in a container in a state where the metallic compounds are held at a filling ratio exhibiting a relative bulk density of 40% or less.

(39) The production method of the phosphor of item (38), characterized in that the container is made of boron nitride.

(40) The production method of the phosphor of any one of items (30) through (39), characterized in that the sintering step is conducted not by means of hot-press, but exclusively by means of ordinary pressure sintering or gas pressure sintering.

(41) The production method of the phosphor of any one of items (30) through (40), characterized in that the method further comprises the step of:

adjusting the synthesized phosphor powder in granularity, to cause the same to have an averaged particle size between 50 nm inclusive and 50 μm inclusive, by a single or multiple procedures selected from pulverization, classification, and acid treatment.

(42) The production method of the phosphor of any one of items (30) through (41), characterized in that the method further comprises the step of:

heat treating the phosphor powder after firing, the phosphor powder after pulverization treatment, or the phosphor powder after granularity adjustment, at a temperature between 1,000° C. inclusive and the firing temperature inclusive.

(43) The production method of the phosphor of any one of items (30) through (42), characterized in that the method further comprises the step of:

washing the product after firing by a solvent comprising water or an acidic water solution, to thereby decrease contents of a glass phase, second phase, flux component phase, or impurity phase included in the product.

(44) The production method of the phosphor of item (43), characterized in that the acid comprises a single or a combination of sulfuric acid, hydrochloric acid, nitric acid, hydrofluoric acid, and organic acids.

(45) The production method of the phosphor of item (43) or (44), characterized in that the acid is a mixture of hydrofluoric acid and sulfuric acid.

(46) A lighting instrument constituted of at least a light-emitting source and a phosphor, characterized in that the phosphor of at least one of items (1) through (29) is used.

(47) The lighting instrument of item (46), characterized in that the light-emitting source is a light emitting diode (LED), laser diode, or organic EL light emitting element for emitting light at a wavelength of 330 to 500 nm.

(48) The lighting instrument of item (46) or (47), characterized in that the light-emitting source is an LED for emitting light at a wavelength between 330 and 420 nm; and that the constituent phosphor is provided by adopting: the phosphor of any one of items (1) through (29); a blue-aimed phosphor for emitting light between 420 nm inclusive and 500 nm inclusive by pump light between 330 and 420 nm; and a green-aimed phosphor for emitting light between 500 nm inclusive and 570 nm inclusive by pump light between 330 and 420 nm; so that the constituent phosphor emits white light mixedly including red light, green light, and blue light.

(49) The lighting instrument of item (46) or (47), characterized in that the light-emitting source is an LED for emitting light at a wavelength between 420 and 500 nm; and that the constituent phosphor is provided by adopting: the phosphor of any one of items (1) through (29); and a green-aimed phosphor for emitting light between 500 nm inclusive and 570 nm inclusive by pump light between 420 and 500 nm; so that the constituent phosphor emits white light.

(50) The lighting instrument of item (46) or (47), characterized in that the light-emitting source is an LED for emitting light at a wavelength between 420 and 500 nm; and that the constituent phosphor is provided by adopting: the phosphor of any one of items (1) through (29); and a yellow-aimed phosphor for emitting light between 550 nm inclusive and 600 nm inclusive by pump light between 420 and 500 nm; so that the constituent phosphor emits white light.

(51) The lighting instrument of item (50), characterized in that the yellow-aimed phosphor is Ca-α-sialon including Eu dissolved therein in a solid state.

(52) The lighting instrument of item (48) or (49), characterized in that the green-aimed phosphor is β-sialon including Eu dissolved therein in a solid state.

(53) An image displaying apparatus constituted of at least an excitation source and a phosphor, characterized in that the phosphor of at least one of items (1) through (29) is used.

(54) The image displaying apparatus of item (53), characterized in that the excitation source is electron beam, electric field, vacuum ultraviolet light, or ultraviolet light.

(55) The image displaying apparatus of item (53) or (54), characterized in that the image displaying apparatus is a vacuum fluorescent display (VFD), field emission display (FED), plasma display panel (PDP), or cathode ray tube (CRT).

EFFECT OF THE INVENTION

The phosphors of the present invention each include, as a main component: a crystal of a specific composition represented by $M_a A_b Si_c O_d N_e$ including a divalent alkaline earth element, Si, oxygen, and nitrogen; and particularly include an inorganic compound as a main component including, as host crystals, $A_2Si_3O_2N_4$ crystal, $A_2Si_3O_2N_4$ solid solution crystal, $A_3Si_3O_3N_4$ crystal, $A_3Si_3O_3N_4$ solid solution crystal, $A_3Si_2O_4N_2$ crystal, or $A_3Si_2O_4N_2$ solid solution crystal, which is activated by an M element such as Eu; so that the phosphors of the present invention exhibit emission at longer wavelengths than those by conventional sialon phosphors and oxynitride phosphors, and the like, and are excellent as phosphors for emission in orange, red, and the like. Such compositions can be synthesized by using, as starting materials, $Si_3N_4$, $SiO_2$, MO (oxide of M), and AO (oxide of A) or $ACO_3$ (carbonate of A) which are stable in air, and thus the compositions are excellent in productivity. Further, the compositions are excellent in chemical stability, thereby providing useful phosphors to be preferably used for VFD, FED, PDP, CRT, white LED, and the like without luminance deterioration even when exposed to excitation sources.

Figure 1:
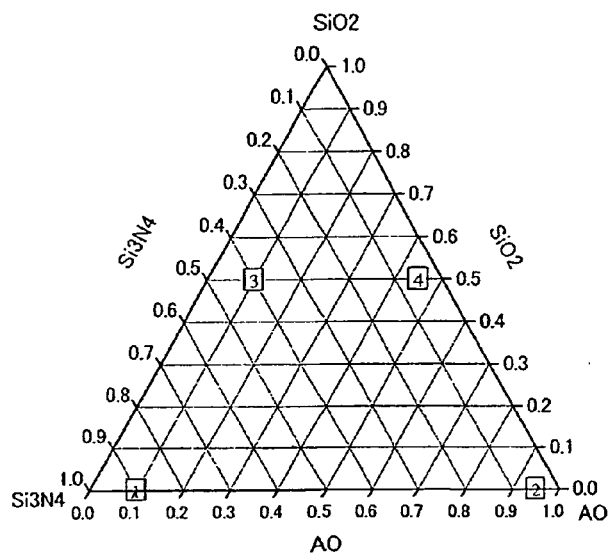
FIG. 1 is a pseudo-ternary phase diagram including AO, $SiO_2$, and $Si_3N_4$ as end members, respectively.

EXPLANATION OF REFERENCE NUMERALS 1 bullet type light emitting diode lamp
2, 3 lead wire
4 light emitting diode element
5 bonding wire
6, 8 resin
7 phosphor
11 chip-type white light emitting diode lamp to be mounted on substrate
12, 13 lead wire
14 light emitting diode element
15 bonding wire
16, 18 resin
17 phosphor
19 alumina ceramic substrate
20 side member
31 red-aimed phosphor
32 green-aimed phosphor
33 blue-aimed phosphor
34, 35, 36 ultraviolet emission cell
37, 38, 39, 40 electrode
41, 42 dielectric layer
43 protection layer
44, 45 glass substrate

BEST MODE FOR CARRYING OUT THE INVENTION

The present invention will be described in detail based on Examples and drawings.

Phosphors of the present invention are each a composition containing at least an activation element M, a divalent alkaline earth element A, nitrogen, oxygen, and Si. Examples of representative constituent elements include: as M, one kind or two or more kinds of element(s) selected from Mn, Ce, Pr, Nd, Sm, Eu, Gd, Tb, Dy, Ho, Er, Tm, and Yb; and as A, one kind or two or more kinds of element(s) selected from Mg, Ca, Sr, and Ba. The phosphors each include, as a main component, an inorganic compound which is constituted of the above listed elements and which comprises:

a composition on a pseudo-ternary phase diagram including AO (AO is oxide of A), $Si_3N_4$, and $SiO_2$ as end members, respectively, and satisfying all of the following conditions:

in a composition formula, $pAO$-$qSi_3N_4$-$rSiO_2$ ($p+q+r=1$), $$0.1 \leq p \leq 0.95 \quad (1),$$

$$0.05 \leq q \leq 0.9 \quad (2), \text{ and}$$

$$0 \leq r \leq 0.5 \quad (3); \text{ and}$$

at least a metallic element M (M is one kind or two or more kinds of element(s) selected from Mn, Ce, Nd, Sm, Eu, Tb, Dy, Ho, Er, Tm, and Yb) dissolved, in a solid state, in the composition.

Here, the pseudo-ternary phase diagram including AO, $Si_3N_4$, and $SiO_2$ as end members, is a representation of compositions including AO, $Si_3N_4$, and $SiO_2$ at apexes of a triangle as shown in FIG. 1, where the conditions (1), (2), and (3) correspond to compositions within a quadrilateral surrounded by points 1, 2, 3, and 4 in FIG. 1.

The phosphors of the present invention each has a composition represented by a composition formula $M_aA_bSi_cO_dN_e$ ($a+b+c+d+e=1$), and the "a" value indicating an adding amount of the photoactive M element is selected from values satisfying the following condition:

$$0.00001 \leq a \leq 0.03 \quad (4).$$

"a" values smaller than 0.00001 lead to a smaller number of elements contributing to light emission, thereby deteriorating an emission intensity. When larger than 0.03, there is caused concentration quenching due to interference among M elements, thereby deteriorating an emission intensity. Particularly, the range of 0.0005 to 0.01 is desirable, by virtue of specifically higher emission intensities then.

Among the inorganic compounds of the present invention, examples of compositions exhibiting specifically higher emission intensities include compositions satisfying the following conditions:

$$d=(a+b) \times f \quad (5),$$

$$e=((4/3) \times c) \times g \quad (6),$$

$$0.8 \leq f \leq 1.25 \quad (7), \text{ and}$$

$$0.8 \leq g \leq 1.25 \quad (8).$$

These compositions will be each called a "$Si_3N_4AO$ type" hereinafter.

When $f=1$ and $g=1$, the composition formula represents a composition $hSi_3N_4+iAO$, which is given along a line connecting between $Si_3N_4$ and AO on the pseudo-ternary phase diagram including AO, $Si_3N_4$, and $SiO_2$ as end members. Here, $hSi_3N_4+iAO$ represents a composition where $Si_3N_4$ and AO are mutually mixed at a molar ratio of h:i. The "f" value and "g" value indicate a discrepancy from $hSi_3N_4+iAO$ which is an ideal value of the composition, and the values are preferably close to $f=1$ and $g=1$. When one of "f" value and "g" value is smaller than 0.8 or larger than 1.25, there are caused products other than the intended crystal phase, thereby deteriorating an emission intensity.

The "d" value indicates an oxygen amount, which is preferably between $0.8\times(a+b)$ inclusive and $1.25\times(a+b)$ inclusive. Values outside this range lead to products other than the intended crystal phase, thereby deteriorating an emission intensity.

The "f" value is a nitrogen amount, which is preferably between $0.8\times((4/3)\times c)$ inclusive and $1.25\times((4/3)\times c)$. Values outside this range lead to products other than the intended crystal phase, thereby deteriorating an emission intensity.

Among compositions of $Si_3N_4AO$ types, examples of compositions of host crystals having specifically higher emission intensities include compositions satisfying $c \leq 3b$. This composition corresponds to the composition $Si_3N_4 \leq AO$ on a binary phase diagram of $Si_3N_4$ and AO, in case of an ideal composition where $f=1$ and $g=1$.

In the $Si_3N_4AO$ types and among compositions on the binary phase diagram of $Si_3N_4$ and AO, examples of host materials exhibiting red light emission at specifically higher luminances include a composition $hSi_3N_4+iAO$ ("h" and "i" are values between 0 inclusive and 1 inclusive, and $0.2 \leq i/(h+i) \leq 0.95$). Among them, $A_2Si_3O_2N_4$ and $A_3Si_3O_3N_4$ crystals exhibit specifically higher emission intensities, respectively. Further, solid solution crystals of these crystals also exhibit excellent emission characteristics, respectively. Furthermore, $ASi_6ON_8$ also exhibits a higher emission intensity. By adopting them as host crystals and activating them with photoactive M elements, respectively, there can be obtained phosphors exhibiting light emission at higher luminances.

Figure 2:
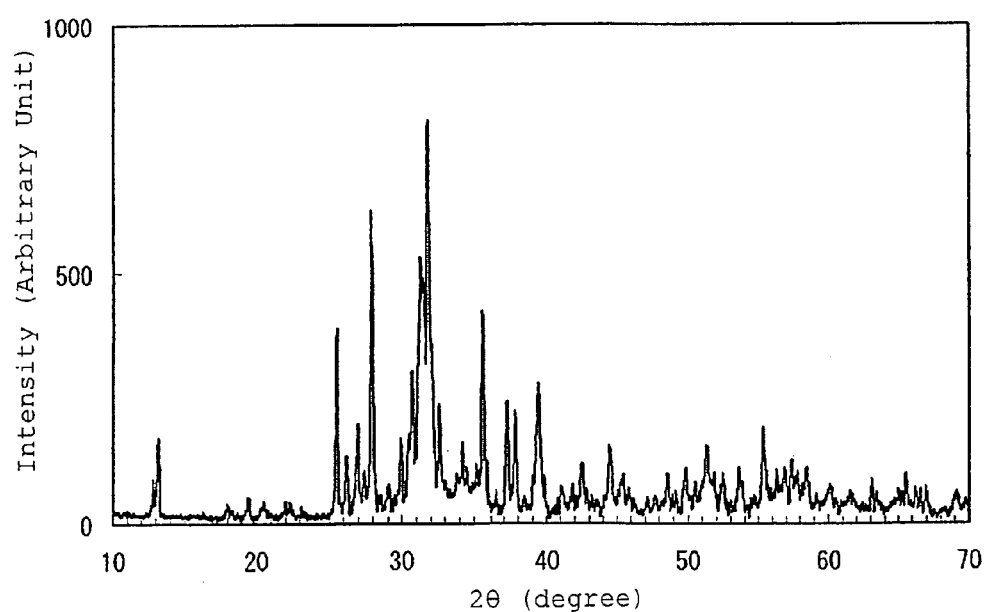
FIG. 2 is an X-ray diffractometry chart of an $Sr_2Si_3O_2N_4$ crystal.

$A_2Si_3O_2N_4$ crystals are inorganic compounds each constituted of silicon nitride ($Si_3N_4$) and alkaline earth oxide (AO) at a composition ratio of 1:2. Although the crystal structure of $A_2Si_3O_2N_4$ is not perfectly clarified in the present state, what has the same X-ray diffractometry data as the diffractometry data shown by the present invention is defined as an $A_2Si_3O_2N_4$ crystal. Further, what has been changed in lattice constant due to solid-state dissolution while maintaining a crystal structure, is defined as an $A_2Si_3O_2N_4$ solid solution crystal. FIG. 2 shows an X-ray diffractometry result of an $Sr_2Si_3O_2N_4$ crystal which is a representative $A_2Si_3O_2N_4$ crystal.

Although solid-state dissolution elements are not specifically specified in an $A_2Si_3O_2N_4$ solid solution crystal, examples of inorganic compounds particularly excellent in chemical stability include $A_2Si_{3-x}Al_xO_{2+x}N_{4-x}$ ($0 \leq x \leq 0.5$). This solid solution is a crystal obtained by substituting a part of Si with Al and a part of N with O in the $A_2Si_3O_2N_4$ crystal. Although solid-state dissolution of Al improves chemical stability, crystal structures are made unstable and luminances are deteriorated when "x" has exceeded 0.5.

Examples of hosts capable of providing phosphors of higher luminances other than the $Si_3N_4AO$ types include compositions satisfying the following conditions:

$$d=(a+b+(1/2)\times c)\times f \quad (10),$$

$$e=c \times g \quad (11),$$

$$0.8 \leq f \leq 1.25 \quad (12), \text{ and}$$

$$0.8 \leq g \leq 1.25 \quad (13).$$

These compositions will be each called a "$Si_2N_2OAO$" type hereinafter.

When $f=1$ and $g=1$, the composition formula represents a composition $hSi_2N_2O+iAO$, which is given along a line connecting between $Si_2N_2O$ (midpoint between $Si_3N_4$ and $SiO_2$) and AO on the pseudo-ternary phase diagram including AO, $Si_3N_4$, and $SiO_2$ as end members. Namely, applicable phosphors each have a composition which can be synthesized by reacting an equimolar mixture of $Si_3N_4$ and $SiO_2$ with a mixture of AO and oxide of M. The "f" value and "g" value indicate a discrepancy from $hSi_2N_2O+iAO$ which is an ideal value of the composition, and the values are preferably close to f=1 and g=1. When one of "f" value and "g" value is smaller than 0.8 or larger than 1.25, there are caused products other than the intended crystal phase, thereby deteriorating an emission intensity.

The "d" value indicates an oxygen amount, which is preferably between $0.8\times(a+b+(1/2)\times c)$ inclusive and $1.25\times(a+b+(1/2)\times c)$ inclusive. Values outside this range lead to products other than the intended crystal phase, thereby deteriorating an emission intensity.

The "e" value indicates a nitrogen amount, which is preferably between $0.8\times c$ inclusive and $1.25\times c$ inclusive. Values outside this range lead to products other than the intended crystal phase, thereby deteriorating an emission intensity.

Among compositions of $Si_2N_2OAO$ types, examples of compositions of host crystals having specifically higher emission intensities include compositions satisfying $c \leqq b$.

This composition corresponds to the composition $Si_2N_2O \leqq 2AO$ in a binary phase diagram of $Si_2N_2O$ and AO, in case of an ideal composition where f=1 and g=1.

In the $Si_2N_2OAO$ types and among compositions on the binary phase diagram of $Si_2N_2O$ and AO, examples of host materials exhibiting red light emission at specifically higher luminances include a composition $hSi_2N_2O+iAO$ ("h" and "i" are values between 0 inclusive and 1 inclusive, and $0.2 \leqq i/(h+i) \leqq 0.9$). Among them, $A_3Si_2O_4N_2$ crystals exhibit specifically higher emission intensities, respectively. Further, solid solution crystals of $A_3Si_2O_4N_2$ also exhibit excellent emission characteristics. By adopting them as host crystals and activating them with photoactive M elements, respectively, there can be obtained phosphors exhibiting light emission at higher luminances.

$A_3Si_2O_4N_2$ crystals are inorganic compounds each constituted of silicon oxynitride ($Si_2N_2O$) and alkaline earth oxide (AO) at a composition ratio of 1:3. Further, what has been changed in lattice constant due to solid-state dissolution while maintaining an $A_3Si_2O_4N_2$ crystal structure, is defined as an $A_3Si_2O_4N_2$ solid solution crystal.

Although solid-state dissolution elements are not specifically specified in an $A_3Si_2O_4N_2$ solid solution crystal, examples of inorganic compounds particularly excellent in chemical stability include $A_3Si_{2-x}Al_xO_{4+x}N_{2-x}$ ($0 \leqq x \leqq 0.5$). This solid solution is a crystal obtained by substituting a part of Si with Al and a part of N with O in the $A_3Si_2O_4N_2$ crystal. Although solid-state dissolution of Al improves chemical stability, crystal structures are made unstable and luminances are deteriorated when "x" has exceeded 0.5.

Other examples of compositions capable of obtaining higher luminance phosphors, include $A_3Si_{3-y}O_{3+y}N_{4-2y}$ crystals ($0 \leqq y \leqq 1.8$) or $A_3Si_{3-y}O_{3+y}N_{4-2y}$ crystals.

Although it is possible to select the element M from Mn, Ce, Pr, Nd, Sm, Eu, Gd, Tb, Dy, Ho, Er, Tm, and Yb depending on a desired fluorescence color, it is particularly preferable to add at least Eu for orange or red light emission at wavelengths from 570 nm to 700 nm. Exclusive addition of Eu is preferable for color exhibition from 620 nm to 630 nm which is desirable for white LED usage. Eu acts as a divalent ion in a phosphor, and exhibits wider orange or red light emission by virtue of transition from a 5d electronic state to a 4f electronic state.

Although it is possible to select the alkaline earth element A from Mg, Ca, Sr, and Ba depending on a desired fluorescence color, it is particularly preferable to add at least Sr for orange or red light emission at wavelengths from 570 nm to 700 nm. Compositions exclusively including Sr allow for obtainment of higher luminance phosphors.

In the present invention, since the $Sr_2Si_3O_2N_4$:Eu obtained by selecting Eu as M and Sr as A emits fluorescence at a higher luminance having an emission peak at a wavelength between 620 nm and 630 nm which is desired for white LED usage, the same is suitable for this usage. Here, the representation of $Sr_2Si_3O_2N_4$:Eu indicates a substance including, as a host crystal, an $Sr_2Si_3O_2N_4$ crystal and Eu acting as a light emitting ion which substitutes for a part of Sr in the host crystal.

Further, examples of inorganic compounds exhibiting red light at higher luminance identically to $Sr_2Si_3O_2N_4$:Eu, include $Sr_3Si_3O_3N_4$:Eu and $Sr_3Si_2O_4N_2$:Eu. Furthermore, since $Sr_2Si_{3-x}Al_xO_{2+x}N_{4-x}$:Eu, $Sr_3Si_{3-x}Al_xO_{3+x}N_{4-x}$:Eu, and $Sr_3Si_{2-x}Al_xO_{4+x}N_{2-x}$:Eu, which are solid solutions thereof, are more excellent in chemical stability than those which do not include Al, the former are suitably utilized depending on the usage.

Those compositions of the present invention which include Ca and Ba as A in addition to Sr, serve as phosphors having emission wavelengths different from those exclusively including Sr in a manner that emission wavelengths are continuously changed by varying mixing amounts, so that the compositions may be suitably selected depending on usage.

In case of utilizing the phosphor of the present invention as a powder, averaged particle sizes between 0.1 μm inclusive and 50 μm inclusive are desirable, from standpoints of dispersibility into resin, flowability of the powder, and the like. Additionally, making the powder as single crystal particles in this range, further improves emission luminance.

To obtain a phosphor having a higher emission luminance, it is desirable to extremely decrease impurities included in the applicable inorganic compound. Particularly, since light emission is obstructed by inclusion of large amounts of Fe, Co, Ni impurity elements, it is desirable to control selecting and synthesizing processes for starting material powders such that the total amount of these impurity elements is limited to 500 ppm or less.

In the present invention, although the $M_aA_bSi_cO_dN_e$ inorganic compounds such as $A_2Si_3O_2N_4$:M and $A_3Si_2O_4N_2$:M acting as constituent components of the oxynitrides are to be highly pure and to be included as much as possible, and are to be possibly and desirably constituted of a single phase from a standpoint of fluorescence emission, it is also possible to constitute the inorganic compound by a mixture with another crystal phase or amorphous phase within an extent where due properties are not deteriorated. In this case, it is desirable that the content of $M_aA_bSi_cO_dN_e$ inorganic compound is 10 mass % or more, so as to obtain higher luminance. More preferably, luminance is remarkably improved by 50 mass % or more. For the range of the main component in the present invention, the content of the $M_aA_bSi_cO_dN_e$ inorganic compound is at least 10 mass % or more. The content of the $M_aA_bSi_cO_dN_e$ inorganic compound can be obtained by multi-phase analysis based on a Rietveld method while conducting X-ray diffractometry. Expediently, it is possible to obtain the content of the $M_aA_bSi_cO_dN_e$ inorganic compound from a ratio of maximum line thereof to those of other crystals by using an X-ray diffractometry result.

When the phosphor of the present invention is used for application where the same is excited by electron beam, it is possible to provide the phosphor with electroconductivity by mixing an inorganic substance having electroconductivity with the phosphor. Examples of inorganic substances having electroconductivity include oxides, oxynitrides, nitrides, and mixtures thereof each including one kind or two or more kinds of element(s) selected from Zn, Al, Ga, In, and Sn.

Although the phosphors of the present invention emit red light, it is possible to mix inorganic phosphors therewith which emit other color(s) such as yellow, green, blue, and the like as required, when the red color is required to be mixed with such other color(s).

As compared with ordinary oxide phosphors or existing sialon phosphors, the phosphors of the present invention to be obtained in the above manner are characterized in that: the present phosphors have wider excitation ranges from electron beam, to X-rays, ultraviolet light, and visible light; that the phosphors exhibit orange or red light emission at 570 nm or longer; and that the phosphors of specific compositions exhibit red light from 600 nm to 650 nm; in a manner to exhibit red light emission in a color range where a "y" value is between 0.44 inclusive and 0.73 inclusive in terms of (x, y) values on CIE chromaticity coordinates. Based on the above emission characteristics, the phosphors are desirable for a lighting instrument and an image displaying apparatus. Additionally, the phosphors are excellent in heat resistance since the same are never deteriorated even when exposed to high temperatures, and the phosphors are also excellent in long-term stability in an oxidative atmosphere and a moisture environment.

Although the phosphors of the present invention are not defined in production method, it is possible to produce the phosphors having higher luminance by the following methods.

It is possible to obtain a higher luminance phosphor by firing, in an inert atmosphere containing nitrogen at a temperature range from 1,200° C. inclusive and 2,200° C. inclusive, a starting material mixture or metallic compound mixture (including Al as required) which is capable of constituting a composition represented by M, A, Si, O, and N when fired.

In case of synthesizing a phosphor containing Eu, Sr, Si, N, and O, it is desirable to adopt, as starting materials, a powdery mixture of europium oxide, strontium carbonate or strontium oxide, silicon nitride, and as required, silicon oxide.

The mixed powder of metallic compounds is desirably fired in a state where the same is held at a filling ratio exhibiting a bulk density of 40% or less. The bulk density is a volumetric filling ratio of a powder of metallic compounds, and indicates a value to be obtained by dividing: a ratio of a mass of the powder filled in a constant container, to the volume of the container; by a theoretical density of the metallic compounds. Suitable as the container is a boron nitride sintered body, since it exhibits a lower reactivity with the metallic compounds.

The reason, why the starting material powder is to be fired in the state where its bulk density is held at 40% or less, is as follows. Namely, firing the powder in a state where free spaces are left around the powder, causes the crystals of reaction products to grow into the free spaces with less contact among the crystals, thereby enabling synthesis of a crystal having fewer surface defects.

Next, the thus obtained metallic compound mixture is fired at a temperature range between 1,200° C. inclusive and 2,200° C. inclusive in an inert atmosphere containing nitrogen, thereby synthesizing a phosphor. Since the firing temperature is high and the firing environment is an inert atmosphere containing nitrogen, the furnace to be used for firing is preferably an electric one in a metal resistance heating type or black lead resistance heating type which utilizes carbon as a material for the hot portion of the furnace. The firing procedure is preferably a sintering procedure such as an ordinary pressure sintering method or a gas pressure sintering method where no mechanical pressurization is applied from the exterior, so as to conduct firing while keeping the bulk density high.

When the powder aggregation obtained by firing is firmly solidified, the same is to be pulverized by a pulverizer such as a ball mill, jet mill, or the like to be commonly used in factories. The pulverization is to be conducted until the averaged particle size becomes 50 µm or less. Particularly desirably, the averaged particle size is between 0.1 µm inclusive and 5 µm inclusive. Averaged particle sizes exceeding 50 µm lead to a deteriorated flowability of the powder and deteriorated dispersibility thereof in the resin, and lead to non-uniform emission intensities site by site upon fabricating a light emitting apparatus by combination with a light emitting element. Averaged particle sizes of 0.1 µm or less lead to a large number of defects at the surface of the phosphor powder, thereby deteriorating emission intensities depending on compositions of the phosphors.

Such defects introduced into the surface of the phosphor powder such as upon pulverization are decreased to improve luminance, by heat treating the phosphor powder after firing, the phosphor powder after pulverization treatment, or the phosphor powder after granularity adjustment, at a temperature between 1,000° C. inclusive and the firing temperature inclusive.

Washing the product after firing by a solvent comprising water or an acidic water solution, allows for decrease of contents of a glass phase, second phase, or impurity phase included in the product, thereby improving luminance. In this case, it is possible to select, as the acid, a single of or a mixture of sulfuric acid, hydrochloric acid, nitric acid, hydrofluoric acid, and organic acids, and there can be obtained a remarkable effect for eliminating impurities by adopting a mixture of hydrofluoric acid and sulfuric acid.

As described above, the phosphors of the present invention each exhibit higher luminances than the conventional sialon phosphors, and are each less in luminance deterioration of the phosphor when exposed to an excitation source, so that the phosphors of the present invention are suitably utilized for VFD, FED, PDP, CRT, white LED, and the like.

The lighting instrument of the present invention is constituted of at least a light-emitting source and the phosphor of the present invention. Examples of the lighting instruments include an LED lighting instrument, a fluorescent lamp, and the like. LED lighting instruments can be produced by utilizing the phosphors of the present invention, based on the known methods such as described in JP-A-5-152609, JP-A-7-99345, JP-2927279, and the like. In this case, desirable examples of light-emitting sources include ones for emitting light at wavelengths of 330 to 500 nm, and particularly, ultra-violet (or violet) LED light emitting elements for 330 to 420 nm, or blue LED light emitting elements for 420 to 500 nm.

Such light emitting elements include ones comprising nitride semiconductor such as GaN, InGaN, or the like, which can be made into light-emitting sources for emitting light at predetermined wavelengths by composition adjustment.

In addition to the way to solely adopt the phosphor of the present invention in a lighting instrument, it is possible to constitute a lighting instrument for emitting light in a desired color by combiningly using a phosphor having another emission characteristic. Examples thereof include a combination of: an ultraviolet LED light emitting element of 330 to 420 nm; a blue-aimed phosphor to be excited at the above-mentioned wavelength to thereby emit light at a wavelength between 420 nm inclusive and 480 nm inclusive; a green-aimed phosphor to be similarly excited to thereby emit light at a wavelength between 500 nm inclusive and 550 nm inclusive; and the phosphor of the present invention. Examples of such blue-aimed phosphors and green-aimed phosphors include $BaMgAl_{10}O_{17}:Eu$ and $BaMgAl_{10}O_{17}:Eu, Mn$, respectively. In this configuration, ultraviolet rays emitted by the LED are irradiated to the phosphors which then emit light in three colors of red, blue, and green, thereby establishing a lighting instrument for emitting white light mixedly including these light.

Another way includes a combination of: a blue LED light emitting element of 420 to 500 nm; a yellow-aimed phosphor to be excited at the above-mentioned wavelength to thereby emit light at a wavelength between 550 nm inclusive and 600 nm inclusive; and the phosphor of the present invention. Examples of such yellow-aimed phosphors include $(Y, Gd)_2(Al, Ga)_5O_{12}:Ce$ described in JP-2927279, α-sialon:Eu described in JP-A-2002-363554, and the like. Among them, Ca-α-sialon including Eu dissolved therein in a solid state is preferable by virtue of a higher emission luminance. In this configuration, blue light emitted by the LED is irradiated to the phosphors which then emit light in two colors of red and yellow, which light is mixed with the blue light by the LED itself, thereby establishing a lighting instrument for emitting light in white or reddish incandescent color.

Still another way includes a combination of: a blue LED light emitting element of 420 to 500 nm; a green-aimed phosphor to be excited at the above-mentioned wavelength to thereby emit light at a wavelength between 500 nm inclusive and 570 nm inclusive; and the phosphor of the present invention. Examples of such green-aimed phosphors include $Y_2Al_5O_{12}:Ce$, β-sialon:Eu, and the like. In this configuration, blue light emitted by the LED is irradiated to the phosphors which then emit light in two colors of red and green, which light is mixed with the blue light by the LED itself, thereby establishing a lighting instrument for emitting white light.

The image displaying apparatus of the present invention is constituted of at least an excitation source and the phosphor of the present invention, and examples thereof include a vacuum fluorescent display (VFD), field emission display (FED), plasma display panel (PDP), cathode ray tube (CRT), and the like. It has been confirmed that the phosphors of the present invention can each emit light by excitation of vacuum ultraviolet light from 100 to 190 nm, ultraviolet light from 190 to 380 nm, electron beam, and the like, and combining such an excitation source with the phosphor of the present invention enables establishment of such an image displaying apparatus as described above.

EXAMPLES

Although the present invention will be detailedly described based on the following Examples, these Examples are merely disclosed to aid in readily understanding the present invention, without limiting the present invention thereto.

Example 1

Firstly, to synthesize $Sr_2Si_3O_2N_4$ without including activation metals M, there were weighed: 32.21 wt % of a silicon nitride powder having an averaged particle size of 0.5 μm, an oxygen content of 0.93 wt %, an α-type content of 92%; and 67.79 wt % of a strontium carbonate powder; and the powders were then mutually mixed for 30 minutes in the atmosphere by an agate pestle and an agate mortar; followed by natural drop of the obtained mixture into a crucible made of boron nitride through a sieve of 500 μm, thereby filling the powder into the crucible. The powder had a bulk density of about 22%. The crucible containing the mixed powder therein was set in an electric furnace of a black lead resistance heating type. There was conducted a firing operation by firstly bringing the firing environment to vacuum by a diffusion pump, heating from a room temperature up to 800° C. at a rate of 500° C./hour, introducing nitrogen at a purity of 99.999 vol % at 800° C. to achieve a pressure of 1 MPa, elevating the temperature to 1,800° C. at a rate of 500° C./hour, and holding for 2 hours at 1,800° C.

Next, the synthesized compound was pulverized by an agate mortar, and there was conducted a powder X-ray diffraction measurement by Kα line of Cu. The resultingly obtained chart is shown in FIG. 2, and there were not detected unreacted $Si_3N_4$, SrO, and the like, and an already reported compound of $Si_3N_4$—SrO type. The substance shown in X-ray diffractometry in FIG. 2 was confirmed to be $Sr_2Si_3O_2N_4$ in a single phase.

Then, there was synthesized $Sr_2Si_3O_2N_4$ activated with Eu. Used as starting material powders were: a silicon nitride powder having an averaged particle size of 0.5 μm, an oxygen content of 0.93 wt %, and an Ca-type content of 92%; a strontium carbonate powder having a specific surface area of 3.3 m²/g; and a europium oxide powder.

To obtain a compound represented by a composition formula $Eu_{0.001818}Sr_{0.18}Si_{0.272727}O_{0.181818}N_{0.363636}$ (Table 1 shows parameters of designed compositions, and Table 2 shows mixture compositions of starting material powders), there were weighed 32.16 wt %, 67.03 wt %, and 0.81 wt % of a silicon nitride powder, a strontium carbonate powder, and a europium oxide powder, respectively; and the powders were then mutually mixed for 30 minutes in the atmosphere by an agate pestle and an agate mortar; followed by natural drop of the obtained mixture into a crucible made of boron nitride through a sieve of 500 μm, thereby filling the powder into the crucible. The powder had a bulk density of about 22%.

The crucible containing the mixed powder therein was set in an electric furnace of a black lead resistance heating type. There was conducted a firing operation by firstly bringing the firing environment to vacuum by a diffusion pump, heating from a room temperature up to 800° C. at a rate of 500° C./hour, introducing nitrogen at a purity of 99.999 vol % at 800° C. to achieve a pressure of 1 MPa, elevating the temperature to 1,800° C. at a rate of 500° C./hour, and holding for 2 hours at 1,800° C.

After firing, the obtained fired body was roughly pulverized, and then manually pulverized by a crucible and a mortar both made of silicon nitride sintered body, followed by passage through a sieve of 30 μm mesh. Measurement of particle size distribution showed an averaged particle size of 10 μm.

Next, the synthesized compound was pulverized by an agate mortar, and there was conducted a powder X-ray diffraction measurement by Kα line of Cu. As a result, the obtained chart was confirmed to represent a crystal having the same crystal structure as an $Sr_2Si_3O_2N_4$ crystal, and any other crystal phases were not detected.

Figure 3:
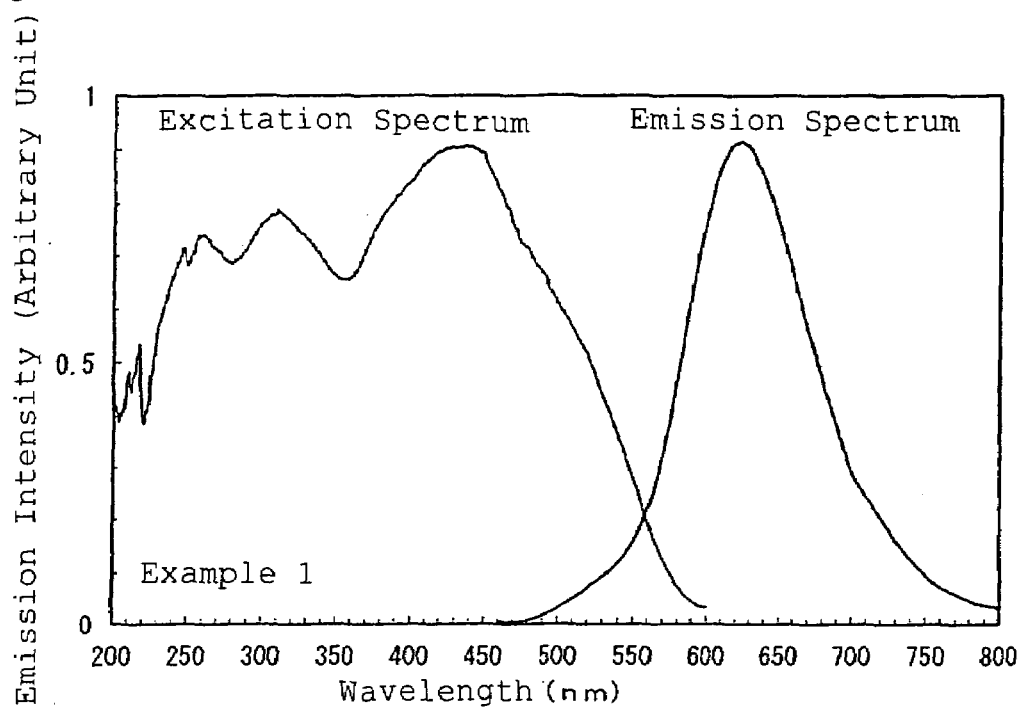
FIG. 3 is a graph showing an emission spectrum and an excitation spectrum of a phosphor (Example 1).

This powder was irradiated by a lamp emitting light at a wavelength of 365 nm, thereby confirming that the powder emitted red light. The powder was measured by a spectrophotofluorometer to provide an emission spectrum and an excitation spectrum (FIG. 3), thereby resultingly showed that the powder was a phosphor having a peak at 438 nm in the excitation spectrum, and a peak at red light of 624 nm in the emission spectrum based on the excitation of 438 nm. The emission intensity at the peak was 0.91 count. Note that the count value has an arbitrary unit, since it varies depending on a measurement device, a measurement condition, and the like. In the present invention, the count value is indicated by standardization such that the emission intensity of a commercially available YAG:Ce phosphor (P46Y3: produced by KASEI OPTONIX, LTD.) becomes 1. Further, the CIE chromaticity obtained from the emission spectrum based on the excitation of 438 nm was red where x=0.61 and y=0.37.

Examples 2 to 37

Used as starting material powders were: a silicon nitride powder having an averaged particle size of 0.5 μm, an oxygen content of 0.93 wt %, and an α-type content of 92%; an aluminum nitride powder having a specific surface area of 3.3 m²/g, and an oxygen content of 0.79%; and a silicon dioxide powder, aluminum oxide powder, strontium carbonate powder, magnesium oxide powder, calcium carbonate powder, barium carbonate powder, and europium oxide. To obtain inorganic compounds of designed compositions listed in Table 1, starting materials were mutually mixed at mixture compositions listed in Table 2, followed by firing in firing conditions listed in Table 3, as well as subsequent application of heat treatment in conditions listed in Table 3 as required, respectively. The inorganic compounds were thus synthesized, by the otherwise same procedures as those in the method for Example 1.

The powders were each measured by a spectrophotofluorometer to provide an emission spectrum and an excitation spectrum, thereby resultingly obtaining phosphors having peak wavelengths in excitation spectra, peak wavelengths in emission spectra, and peak emission intensities in the emission spectra listed in Table 4, respectively.

Figure 4:
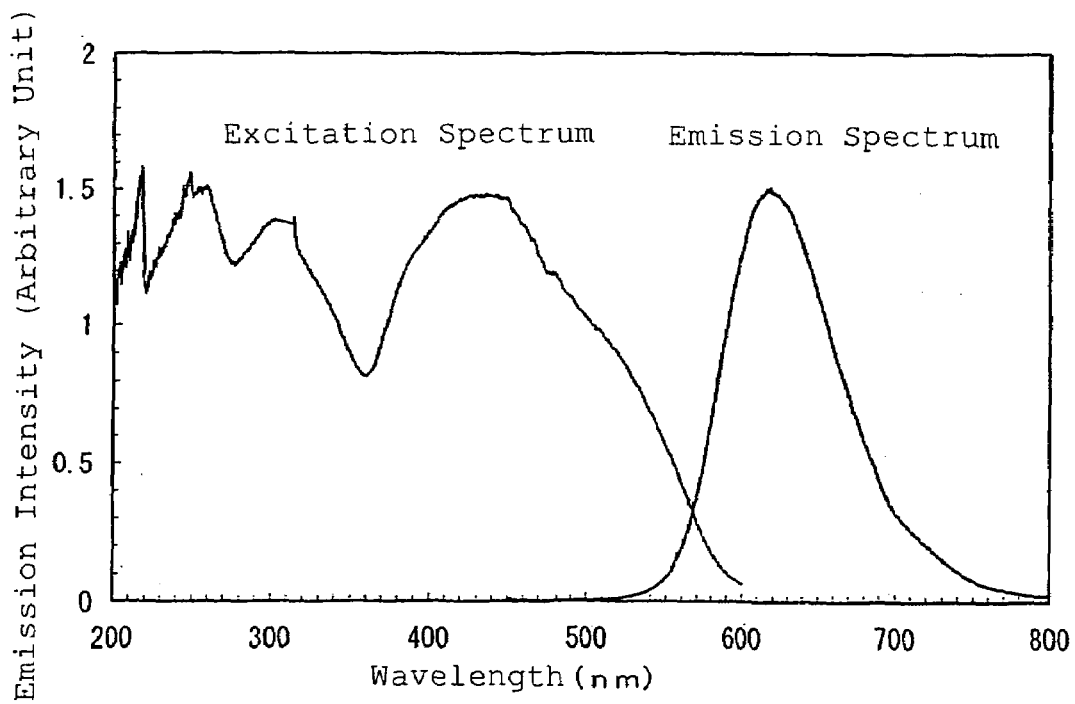
FIG. 4 is a graph showing an emission spectrum and an excitation spectrum of a phosphor (Example 22).

Example 22 had an emission intensity of 1.506 which was the highest in the Examples. Its emission spectrum and excitation spectrum are shown in FIG. 4. The excitation spectrum has a peak wavelength of 438 nm, and the emission spectrum has a peak wavelength of 619 nm. Further, the CIE chromaticity obtained from the emission spectrum based on excitation of 438 nm was red where x=0.62 and y=0.37.

The above results are collectively listed in Table 1 through Table 4 below. The details thereof are follows.

Table 1 shows parameters of designed compositions of Examples 1 through 37, respectively.

Table 2 shows mixture compositions of starting material powders of Examples 1 through 37, respectively.

Table 3 shows firing conditions and heat treatment conditions of Examples 1 through 37, respectively.

Table 4 shows peak wavelengths of excitation spectra, and peak wavelengths and peak intensities of emission spectra of Examples 1 through 37, respectively.

TABLE 1

Parameter of Designed Composition

| Example | Eu(M) a | A (parameter b) Mg | Ca | Sr | Ba | Si c | O d | N e |
|---|---|---|---|---|---|---|---|---|
| 1 | 0.0018 | 0 | 0 | 0.1800 | 0 | 0.2727 | 0.1818 | 0.3636 |
| 2 | 0.0011 | 0 | 0 | 0.1100 | 0 | 0.3333 | 0.1111 | 0.4444 |
| 3 | 0.0006 | 0 | 0 | 0.0619 | 0 | 0.3750 | 0.0625 | 0.5000 |
| 4 | 0.0004 | 0 | 0 | 0.0430 | 0 | 0.3913 | 0.0435 | 0.5217 |
| 5 | 0.0003 | 0 | 0 | 0.0330 | 0 | 0.4000 | 0.0333 | 0.5333 |
| 6 | 0.0003 | 0 | 0 | 0.0268 | 0 | 0.4054 | 0.0270 | 0.5405 |
| 7 | 0.0002 | 0 | 0 | 0.0225 | 0 | 0.4091 | 0.0227 | 0.5455 |
| 8 | 0.0002 | 0 | 0 | 0.0171 | 0 | 0.4138 | 0.0172 | 0.5517 |
| 9 | 0.0002 | 0 | 0 | 0.0152 | 0 | 0.4154 | 0.0154 | 0.5538 |
| 10 | 0.0011 | 0 | 0 | 0.1100 | 0 | 0.3333 | 0.1111 | 0.4444 |
| 11 | 0.0015 | 0 | 0 | 0.1485 | 0 | 0.3000 | 0.1500 | 0.4000 |
| 12 | 0.0017 | 0 | 0 | 0.1681 | 0 | 0.2830 | 0.1698 | 0.3774 |
| 13 | 0.0019 | 0 | 0 | 0.1911 | 0 | 0.2632 | 0.1930 | 0.3509 |
| 14 | 0.0020 | 0 | 0 | 0.2014 | 0 | 0.2542 | 0.2034 | 0.3390 |
| 15 | 0.0021 | 0 | 0 | 0.2110 | 0 | 0.2459 | 0.2131 | 0.3279 |
| 16 | 0.0022 | 0 | 0 | 0.2200 | 0 | 0.2381 | 0.2222 | 0.3175 |
| 17 | 0.0023 | 0 | 0 | 0.2285 | 0 | 0.2308 | 0.2308 | 0.3077 |
| 18 | 0.0024 | 0 | 0 | 0.2364 | 0 | 0.2239 | 0.2388 | 0.2985 |
| 19 | 0.0025 | 0 | 0 | 0.2475 | 0 | 0.2143 | 0.2500 | 0.2857 |
| 20 | 0.0027 | 0 | 0 | 0.2640 | 0 | 0.2000 | 0.2667 | 0.2667 |
| 21 | 0.0018 | 0 | 0 | 0.1800 | 0 | 0.2727 | 0.1818 | 0.3636 |
| 22 | 0.0024 | 0 | 0 | 0.2364 | 0 | 0.2239 | 0.2388 | 0.2985 |
| 23 | 0.0025 | 0 | 0 | 0.2475 | 0 | 0.2143 | 0.2500 | 0.2857 |
| 24 | 0.0027 | 0 | 0 | 0.2640 | 0 | 0.2000 | 0.2667 | 0.2667 |
| 25 | 0.0073 | 0 | 0 | 0.1745 | 0 | 0.2727 | 0.1818 | 0.3636 |
| 26 | 0.0018 | 0 | 0 | 0.1800 | 0 | 0.2727 | 0.1818 | 0.3636 |
| 27 | 0.0011 | 0 | 0 | 0.1807 | 0 | 0.2727 | 0.1818 | 0.3636 |
| 28 | 0.0005 | 0 | 0 | 0.1813 | 0 | 0.2727 | 0.1818 | 0.3636 |
| 29 | 0.0073 | 0 | 0 | 0.1745 | 0 | 0.2727 | 0.1818 | 0.3636 |
| 30 | 0.0036 | 0 | 0 | 0.1782 | 0 | 0.2727 | 0.1818 | 0.3636 |
| 31 | 0.0011 | 0 | 0 | 0.1807 | 0 | 0.2727 | 0.1818 | 0.3636 |
| 32 | 0.0005 | 0 | 0 | 0.1813 | 0 | 0.2727 | 0.1818 | 0.3636 |
| 33 | 0.0036 | 0 | 0.0356 | 0.1425 | 0 | 0.2727 | 0.1818 | 0.3636 |
| 34 | 0.0036 | 0.0891 | 0 | 0.0891 | 0 | 0.2727 | 0.1818 | 0.3636 |
| 35 | 0.0036 | 0.0356 | 0 | 0.1425 | 0 | 0.2727 | 0.1818 | 0.3636 |
| 36 | 0.0036 | 0 | 0 | 0.0356 | 0.1425 | 0.2727 | 0.1818 | 0.3636 |
| 37 | 0.0036 | 0 | 0 | 0.0891 | 0.0891 | 0.2727 | 0.1818 | 0.3636 |

TABLE 2

Mixture Composition (Mass %) of Starting Materials

| Example | Si$_3$N$_4$ | MgO | CaCO$_3$ | SrCO$_3$ | BaCO$_3$ | Eu$_2$O$_3$ |
|---|---|---|---|---|---|---|
| 1 | 32.17 | 0 | 0 | 67.03 | 0 | 0.81 |
| 2 | 48.67 | 0 | 0 | 50.72 | 0 | 0.61 |
| 3 | 65.48 | 0 | 0 | 34.11 | 0 | 0.41 |
| 4 | 73.99 | 0 | 0 | 25.70 | 0 | 0.31 |
| 5 | 79.14 | 0 | 0 | 20.61 | 0 | 0.25 |
| 6 | 82.58 | 0 | 0 | 17.21 | 0 | 0.21 |
| 7 | 85.05 | 0 | 0 | 14.77 | 0 | 0.18 |
| 8 | 88.35 | 0 | 0 | 11.51 | 0 | 0.14 |
| 9 | 89.51 | 0 | 0 | 10.36 | 0 | 0.12 |
| 10 | 48.67 | 0 | 0 | 50.72 | 0 | 0.61 |
| 11 | 38.73 | 0 | 0 | 60.54 | 0 | 0.73 |
| 12 | 34.51 | 0 | 0 | 64.72 | 0 | 0.78 |
| 13 | 30.12 | 0 | 0 | 69.05 | 0 | 0.83 |
| 14 | 28.32 | 0 | 0 | 70.83 | 0 | 0.85 |
| 15 | 26.73 | 0 | 0 | 72.40 | 0 | 0.87 |
| 16 | 25.30 | 0 | 0 | 73.81 | 0 | 0.89 |
| 17 | 24.02 | 0 | 0 | 75.08 | 0 | 0.90 |
| 18 | 22.86 | 0 | 0 | 76.22 | 0 | 0.92 |
| 19 | 21.32 | 0 | 0 | 77.75 | 0 | 0.94 |
| 20 | 19.16 | 0 | 0 | 79.87 | 0 | 0.96 |
| 21 | 32.17 | 0 | 0 | 67.03 | 0 | 0.81 |
| 22 | 22.86 | 0 | 0 | 76.22 | 0 | 0.92 |
| 23 | 21.32 | 0 | 0 | 77.75 | 0 | 0.94 |
| 24 | 19.16 | 0 | 0 | 79.87 | 0 | 0.96 |
| 25 | 32.04 | 0 | 0 | 64.74 | 0 | 3.22 |
| 26 | 32.17 | 0 | 0 | 67.03 | 0 | 0.81 |
| 27 | 32.18 | 0 | 0 | 67.33 | 0 | 0.48 |
| 28 | 32.19 | 0 | 0 | 67.56 | 0 | 0.24 |
| 29 | 31.96 | 0 | 0 | 63.23 | 0 | 4.81 |
| 30 | 31.79 | 0 | 0 | 60.23 | 0 | 7.98 |
| 31 | 31.59 | 0 | 0 | 56.52 | 0 | 11.89 |
| 32 | 31.39 | 0 | 0 | 52.86 | 0 | 15.75 |
| 33 | 33.56 | 0 | 9.39 | 55.37 | 0 | 1.68 |
| 34 | 42.32 | 11.92 | 0 | 43.65 | 0 | 2.12 |
| 35 | 35.55 | 4.00 | 0 | 58.66 | 0 | 1.78 |
| 36 | 27.26 | 0 | 0 | 11.25 | 60.13 | 1.37 |
| 37 | 28.90 | 0 | 0 | 29.81 | 39.84 | 1.45 |

TABLE 3

Firing and Heat Treatment Conditions

| Example | Firing Condition | | | Heat Treatment Condition | | |
|---|---|---|---|---|---|---|
| | Temperature (° C.) | Time (hour) | Gas Pressure | Temperature (° C.) | Time (hour) | Gas Pressure |
| 1 | 1800 | 2 | 10 | | | |
| 2 | 1800 | 2 | 10 | | | |
| 3 | 1800 | 2 | 10 | | | |
| 4 | 1800 | 2 | 10 | | | |
| 5 | 1800 | 2 | 10 | | | |
| 6 | 1800 | 2 | 10 | | | |
| 7 | 1800 | 2 | 10 | | | |
| 8 | 1800 | 2 | 10 | | | |
| 9 | 1800 | 2 | 10 | | | |
| 10 | 1600 | 2 | 5 | | | |
| 11 | 1600 | 2 | 5 | | | |
| 12 | 1600 | 2 | 5 | | | |
| 13 | 1600 | 2 | 5 | | | |
| 14 | 1600 | 2 | 5 | | | |
| 15 | 1600 | 2 | 5 | | | |
| 16 | 1600 | 2 | 5 | | | |
| 17 | 1600 | 2 | 5 | | | |
| 18 | 1600 | 2 | 5 | | | |
| 19 | 1600 | 2 | 5 | | | |
| 20 | 1600 | 2 | 5 | | | |
| 21 | 1600 | 2 | 5 | 1600 | 2 | 5 |
| 22 | 1600 | 2 | 5 | 1600 | 2 | 5 |
| 23 | 1600 | 2 | 5 | 1600 | 2 | 5 |
| 24 | 1600 | 2 | 5 | 1600 | 2 | 5 |
| 25 | 1800 | 6 | 5 | | | |
| 26 | 1800 | 6 | 5 | | | |
| 27 | 1800 | 6 | 5 | | | |
| 28 | 1800 | 6 | 5 | | | |
| 29 | 1600 | 2 | 5 | | | |
| 30 | 1600 | 2 | 5 | | | |
| 31 | 1600 | 2 | 5 | | | |
| 32 | 1600 | 2 | 5 | | | |
| 33 | 1600 | 2 | 5 | | | |
| 34 | 1600 | 2 | 5 | | | |
| 35 | 1600 | 2 | 5 | | | |
| 36 | 1600 | 2 | 5 | | | |
| 37 | 1600 | 2 | 5 | | | |

TABLE 4

Peak Wavelengths and Peak Emission Intensities of Excitation and Emission Spectra

| Example | Excitation Peak wavelength nm | Emission Peak wavelength nm | Emission Intensity arbitrary unit |
|---|---|---|---|
| 1 | 438 | 624 | 0.9070 |
| 2 | 412 | 615 | 0.4012 |
| 3 | 375 | 542 | 0.3488 |
| 4 | 376 | 538 | 0.2813 |
| 5 | 376 | 542 | 0.3232 |
| 6 | 376 | 539 | 0.2687 |
| 7 | 376 | 538 | 0.2326 |
| 8 | 378 | 538 | 0.2873 |
| 9 | 378 | 538 | 0.2075 |
| 10 | 415 | 621 | 0.1716 |
| 11 | 425 | 620 | 0.5103 |
| 12 | 420 | 621 | 0.1714 |
| 13 | 421 | 620 | 0.4294 |
| 14 | 420 | 621 | 0.1741 |
| 15 | 420 | 619 | 0.1522 |
| 16 | 418 | 620 | 0.0820 |
| 17 | 433 | 621 | 0.6707 |
| 18 | 433 | 623 | 0.8506 |
| 19 | 433 | 621 | 0.8315 |
| 20 | 445 | 621 | 0.9598 |
| 21 | 433 | 620 | 0.8713 |
| 22 | 438 | 619 | 1.5057 |
| 23 | 438 | 621 | 1.3682 |
| 24 | 446 | 623 | 1.3107 |
| 25 | 448 | 644 | 0.7740 |
| 26 | 448 | 633 | 0.7150 |
| 27 | 436 | 624 | 0.7000 |
| 28 | 437 | 621 | 0.6595 |
| 29 | 449 | 653 | 0.7778 |
| 30 | 449 | 663 | 0.8867 |
| 31 | 449 | 675 | 0.7430 |
| 32 | 492 | 680 | 0.6515 |
| 33 | 449 | 640 | 0.7259 |
| 34 | 380 | 542 | 0.5200 |
| 35 | 449 | 628 | 0.4474 |
| 36 | 368 | 520 | 0.7380 |
| 37 | 449 | 648 | 0.2595 |

Example 38

To obtain an inorganic compound Ca$_{0.95}$Eu$_{0.05}$Si$_5$ON$_8$ to be provided by activating a CaSi$_6$ON$_8$ crystal with Eu, there were mixed a silicon nitride powder, a calcium carbonate powder, and a europium oxide powder at a ratio of 72.977 mass %, 24.73 mass %, and 2.29 mass %, respectively, followed by firing for 2 hours at 1,800° C. in nitrogen at 0.45 MPa, thereby synthesizing a phosphor. The synthesis was conducted in the otherwise same procedures as those in the method for Example 1. According to X-ray diffractometry measurement, the obtained inorganic compound exhibited the same X-ray diffractometry pattern as the $CaSi_6ON_8$ crystal, and was thus confirmed to be an inorganic compound obtained by activating a $CaSi_6ON_8$ crystal with Eu.

Figure 10:
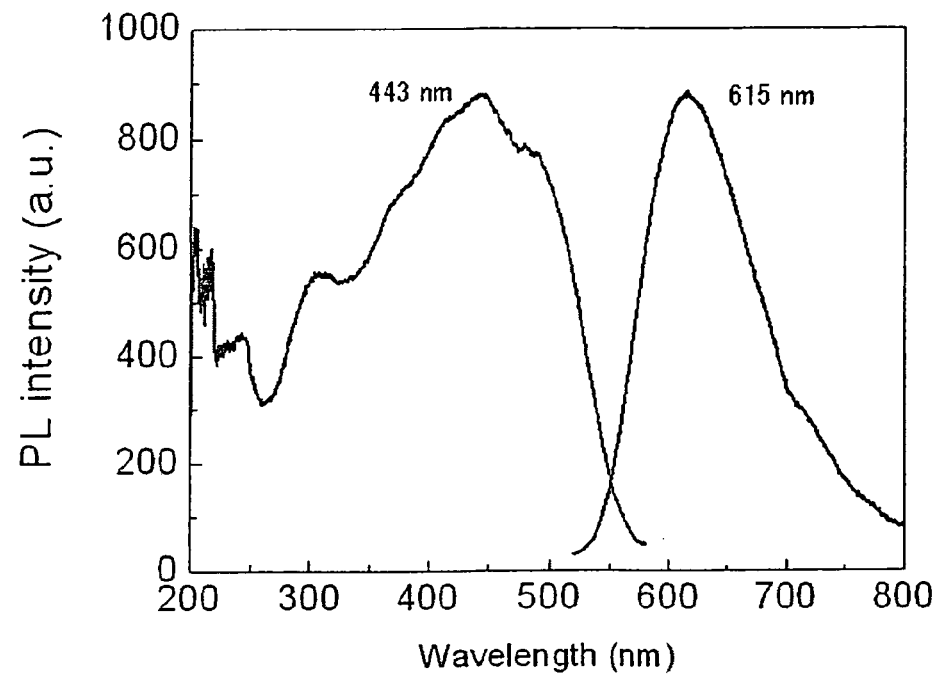
FIG. 10 is a graph showing an emission spectrum and an excitation spectrum of a phosphor (Example 38).

The powder was measured by a spectrophotofluorometer to obtain an emission spectrum and an excitation spectrum, thereby resultingly obtaining a phosphor having properties of excitation spectrum and emission spectrum shown in FIG. 10.

Example 39

To obtain an inorganic compound $Sr_{0.95}Eu_{0.05}Si_5ON_8$ to be provided by activating an $SrSi_6ON_8$ crystal with Eu, there were mixed a silicon nitride powder, a strontium carbonate powder, and a europium oxide powder at a ratio of 72.42 mass %, 25.412 mass %, and 2.168 mass %, respectively, followed by firing for 2 hours at 1,800° C. in nitrogen at 0.45 MPa, thereby synthesizing a phosphor. The synthesis was conducted in the otherwise same procedures as those in the method for Example 1. According to X-ray diffractometry measurement, the obtained inorganic compound exhibited the same X-ray diffractometry pattern as the $SrSi_6ON_8$ crystal, and was thus confirmed to be an inorganic compound obtained by activating an $SrSi_6ON_8$ crystal with Eu.

Figure 11:
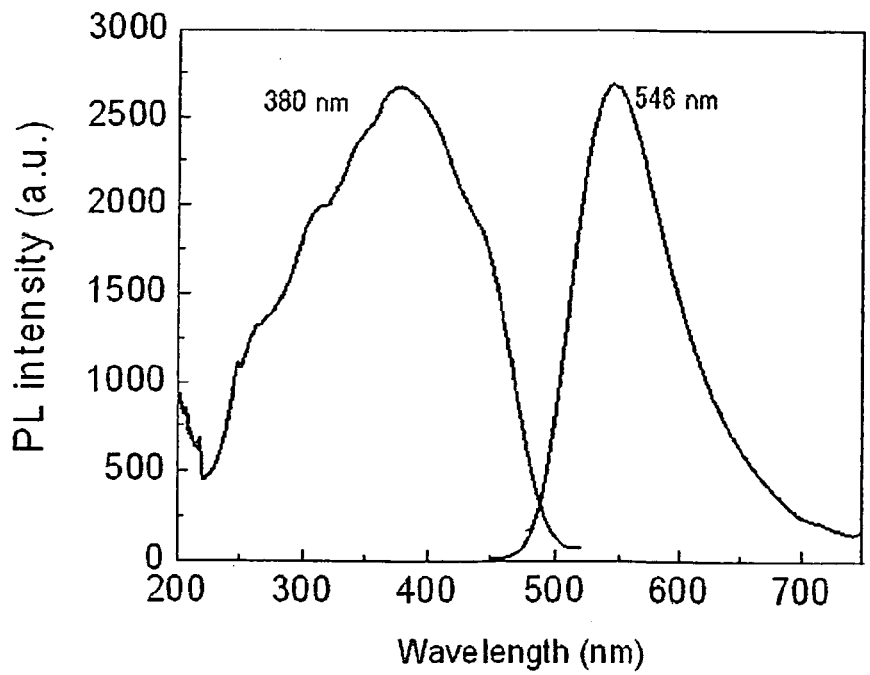
FIG. 11 is a graph showing an emission spectrum and an excitation spectrum of a phosphor (Example 39).

The powder was measured by a spectrophotofluorometer to obtain an emission spectrum and an excitation spectrum, thereby resultingly obtaining a phosphor having properties of excitation spectrum and emission spectrum shown in FIG. 11.

Example 40

To obtain an inorganic compound $Ba_{0.95}Eu_{0.05}Si_5ON_8$ to be provided by activating a $BaSi_6ON_8$ crystal with Eu, there were mixed a silicon nitride powder, a calcium carbonate powder, and a europium oxide powder at a ratio of 64.555 mass %, 33.513 mass %, and 1.932 mass %, respectively, followed by firing for 2 hours at 1,800° C. in nitrogen at 0.45 MPa, thereby synthesizing a phosphor. The synthesis was conducted in the otherwise same procedures as those in the method for Example 1. According to X-ray diffractometry measurement, the obtained inorganic compound exhibited the same X-ray diffractometry pattern as the $BaSi_6ON_8$ crystal, and was thus confirmed to be an inorganic compound obtained by activating a $BaSi_6ON_8$ crystal with Eu.

Figure 12:
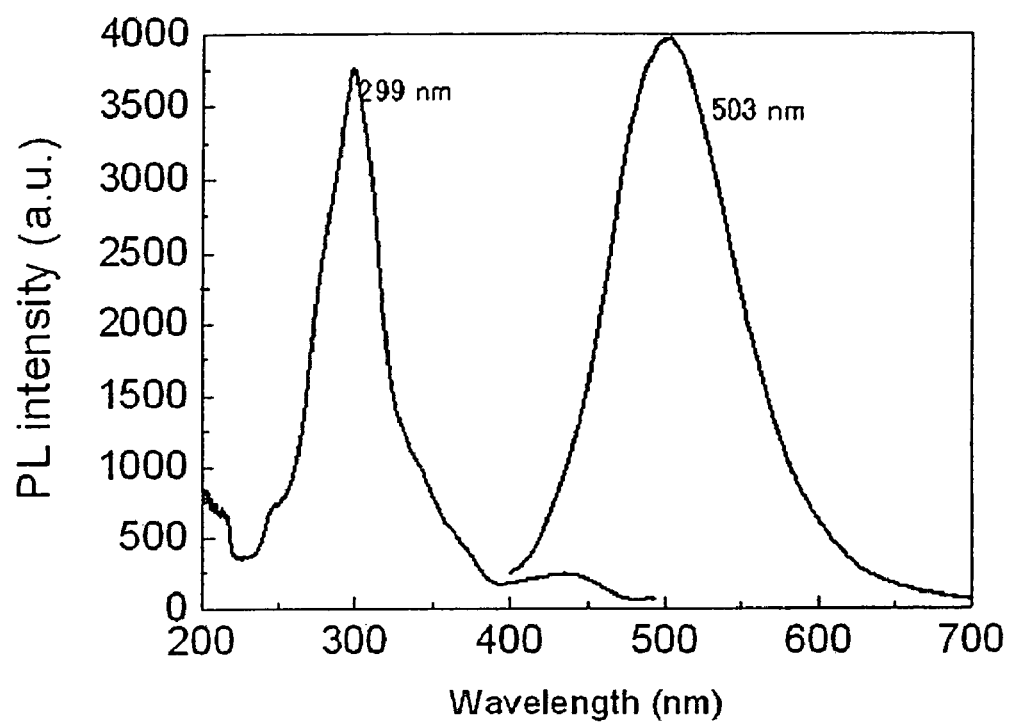
FIG. 12 is a graph showing an emission spectrum and an excitation spectrum of a phosphor (Example 40).

The powder was measured by a spectrophotofluorometer to obtain an emission spectrum and an excitation spectrum, thereby resultingly obtaining a phosphor having properties of excitation spectrum and emission spectrum shown in FIG. 12.

There will be now explained lighting instruments each adopting the phosphor comprising the nitride of the present invention.

Example 41

Firstly, as a green-aimed phosphor to be used for a lighting instrument, there was synthesized a phosphor, i.e., β-sialon: Eu comprising β-sialon containing Eu dissolved therein in a solid state.

Figure 5:
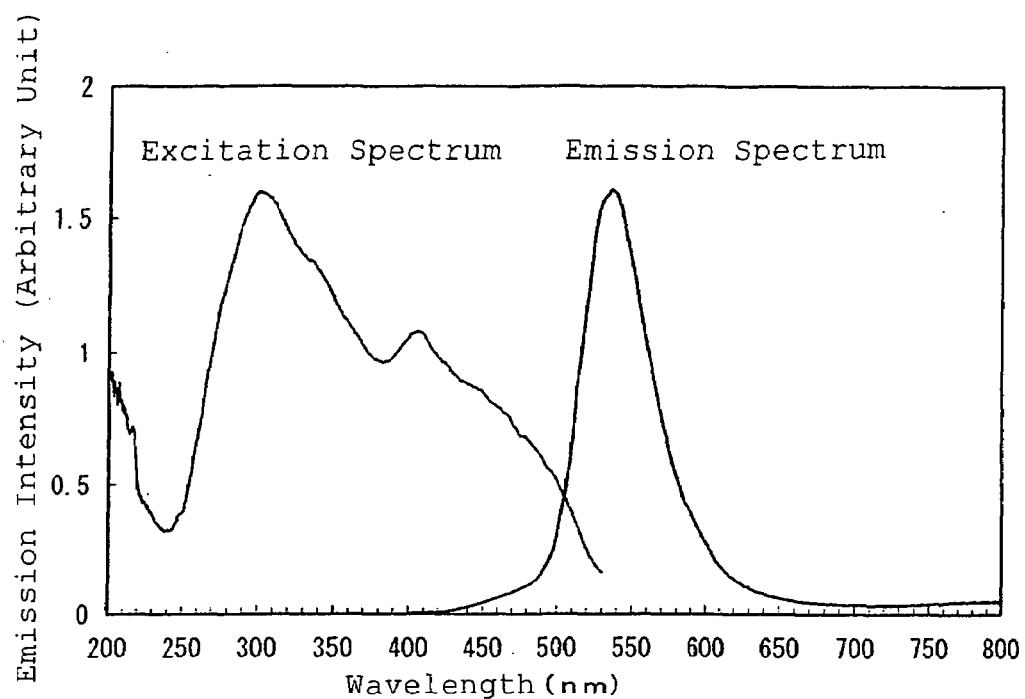
FIG. 5 is a graph showing an emission spectrum and an excitation spectrum of β-sialon:Eu green-aimed phosphor.

Namely, to obtain a compound represented by a composition formula $Eu_{0.00296}Si_{0.41395}Al_{0.01334}O_{0.00444}N_{0.56528}$, there were mixed a silicon nitride powder, an aluminum nitride powder, and a europium oxide powder at a ratio of 94.77 wt %, 2.68 wt %, and 2.556 wt %, respectively, followed by loading into a crucible made of boron nitride and by firing for 8 hours at 1,900° C. in nitrogen gas at 1 MPa. The thus obtained powder was an inorganic compound comprising β-sialon containing Eu dissolved therein in a solid state, and was a green-aimed phosphor as seen from an excitation spectrum and an emission spectrum of FIG. 5.

Figure 6:
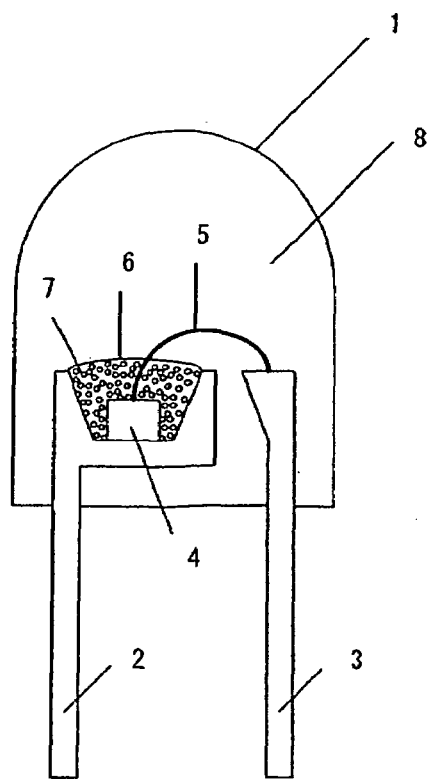
FIG. 6 is a schematic view of a lighting instrument (LED lighting instrument) according to the present invention.

There was fabricated a so-called bullet-type white light emitting diode lamp (1) shown in FIG. 6. It included two lead wires (2, 3), one (2) of which had a depression having a blue light emitting diode element (4) placed therein. The blue light emitting diode element (4) had a lower electrode electrically connected to a bottom surface of the depression by an electroconductive paste, and an upper electrode electrically connected to the other lead wire (3) via thin gold line (5).

There was used a phosphor obtained by mixing a first phosphor and a second phosphor. The first phosphor was the β-sialon:Eu synthesized in this Example, and the second phosphor was one synthesized in Example 22. Mounted near the light emitting diode element (4) was the phosphor (7) obtained by mixing the first phosphor and the second phosphor and which was dispersed in a resin. The phosphors were dispersed in a first resin (6) which was transparent and which covered the whole of the blue light emitting diode element (4). Encapsulated in a second transparent resin (8) were the tip end of the lead wire including the depression, the blue light emitting diode element, and the first resin including the phosphors dispersed therein. The second transparent resin (8) was in a substantially column shape as a whole, and had a tip end portion of a curved surface in a lens shape, which is typically called a bullet type.

Figure 7:
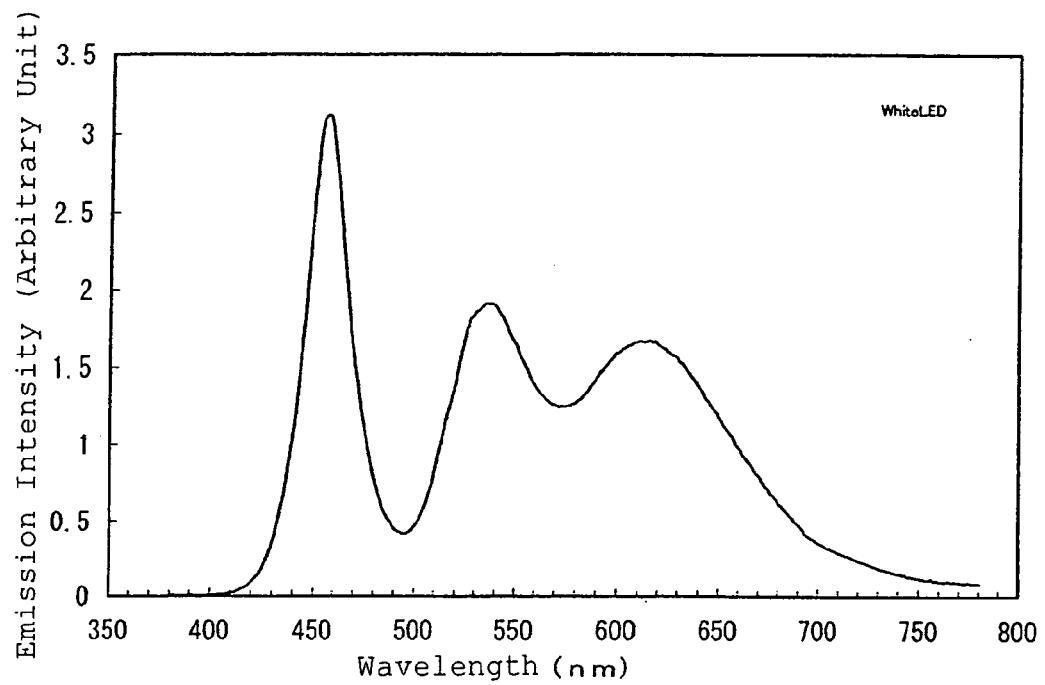
FIG. 7 is a graph showing an emission spectrum of the lighting instrument.

In this Example, the mixing ratio between the first phosphor powder and second phosphor powder was set to be 5:1, this mixed powder was blended into an epoxy resin at a concentration of 35 wt %, and the resultant resin was dropped at an appropriate amount by a dispenser, thereby forming the first resin (6) including the mixed phosphor (7) dispersed therein. The obtained chromaticity was white where x=0.33 and y=0.33. FIG. 7 shows an emission spectrum of this white light emitting diode.

There will be next explained a producing procedure of the bullet type white light emitting diode of this first configuration. Firstly, the blue light emitting diode element (4) is die-bonded by an electroconductive paste onto the element placement depression of one (2) of the paired lead wires, to thereby electrically connect the lead wire to the lower electrode of the blue light emitting diode element and to fix the blue light emitting diode element (4). Next, the upper electrode of the blue light emitting diode element (4) is die bonded to the other of lead wires, thereby electrically connecting them to each other.

Previously mixed with each other at a mixing ratio of 5:2 are the first green-aimed phosphor powder and the second red-aimed phosphor powder, and this mixed phosphor powder is mixed into an epoxy resin at a concentration of 35 wt %. Next, the resultant resin is coated in an appropriate amount onto the depression by a dispenser to cover the blue light emitting diode element, and then cured to form the first resin (6). Finally, the tip end of the lead wire including the depression, the blue light emitting diode element, and the first resin including the phosphors dispersed therein, are wholly encapsulated in the second resin by a casting method.

Although the same epoxy resin was used for the first resin and second resin in this Example, it is possible to adopt another resin such as a silicone resin, or a transparent material such as glass. It is desirable to select a material which is less in degradation due to ultraviolet light.

Example 42

Figure 8:
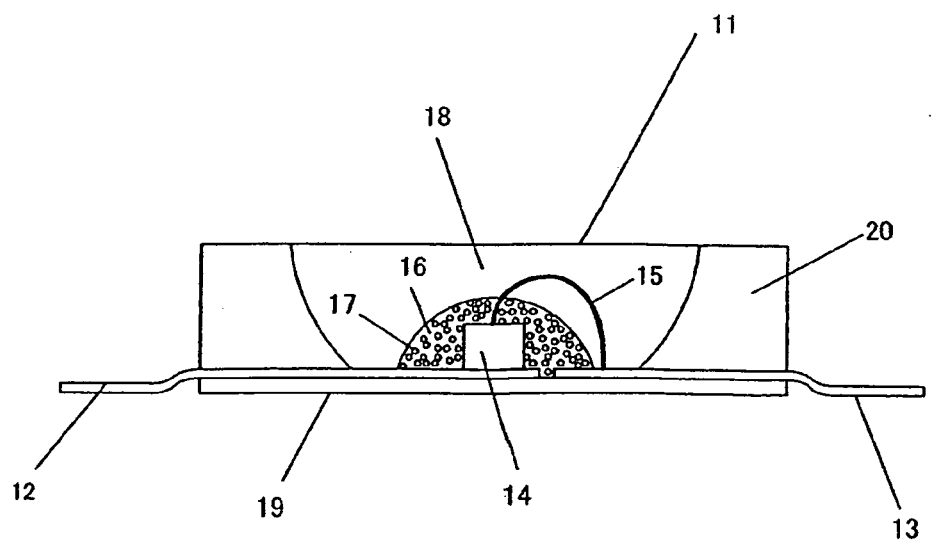
FIG. 8 is a schematic view of a lighting instrument (LED lighting instrument) according to the present invention.

There was fabricated a chip-type white light emitting diode lamp (21) to be mounted on a substrate. Its configuration is shown in FIG. 8.

It included a white alumina ceramic substrate (29) having a higher reflectivity to visible light, and two lead wires (22, 23) fixed thereto, and the lead wires each included one end located at substantially the center position of the substrate, and the other end drawn out to the exterior to form an electrode to be soldered to an electric substrate upon mounting thereto. Placed onto and fixed to the one end of one (22) of the lead wires, was a blue light emitting diode element (24) so as to be located at the central portion of the substrate. The blue light emitting diode element (24) had a lower electrode electrically connected to the lead wire thereunder by an electroconductive paste, and an upper electrode electrically connected to the other lead wire (23) by a thin gold line (25).

Mounted near the light emitting diode element was a resin including a phosphor (27) which was dispersed therein and which was obtained by mixing a first resin and a second phosphor with each other. The first resin (26) including the phosphor dispersed therein was transparent and covered the whole of the blue light emitting diode element (24). Further, fixed on the ceramic substrate was a wall surface member (30) in a shape having a hole at a central portion. As shown in FIG. 8, the wall surface member (30) had its central portion acting as the hole for accommodating therein the blue light emitting diode element (24) and the first resin (26) including the phosphor (27) dispersed therein, and had a portion which was faced to the center and which was formed into an inclined surface. This inclined surface was a reflective surface for forwardly directing light-beams, and had a curved shape to be determined in consideration of the reflected directions of light-beams. Further, at least the surface which constituted the reflective surface, was formed into a surface which was white in color or had metallic luster and which had a higher reflectivity to visible light. In this embodiment, the wall surface member was constituted of a white silicone resin (30). While the hole of the wall surface member at its central portion constitutes a depression as a final shape of the chip-type light emitting diode lamp, the depression is filled with a second transparent resin (28) in a manner to encapsulate all the blue light emitting diode element (24) and the first resin (26) including the phosphor (27) dispersed therein. Adopted as the first resin (26) and second resin (28) in this Example was the same epoxy resin. The mixing ratio between the first phosphor and second phosphor, the achieved chromaticity, and the like were substantially the same as those of the first configuration. The producing procedure was substantially the same as that of the first configuration, except for a step for fixing the lead wires (22, 23) and the wall surface member (30) to the alumina ceramic substrate (29).

Example 43

There will be described a lighting apparatus having a configuration different from the above. This is provided based on the lighting apparatus of FIG. 6, in a structure including: a blue LED of 450 nm as a light emitting element; and a Phosphor dispersion resin layer covered on the blue LED, the resin layer being provided by dispersing, in a layer of resin, the phosphor of Example 1 of the present invention and a yellow-aimed phosphor of Ca-α-sialon:Eu having a composition of $Ca_{0.75}Eu_{0.25}Si_{8.625}Al_{3.375}O_{1.125}N_{14.875}$. Flowing an electric current through electroconductive terminals of the LED caused it to emit light at 450 nm, which excited the yellow-aimed phosphor and red-aimed phosphor to cause them to emit yellow light and red light, respectively, thereby clarifying that the structure was capable of functioning as a lighting instrument for emitting incandescent color light mixedly including the LED light, yellow light, and red light.

Example 44

There will be described a lighting apparatus having another configuration different from the above. This is provided based on the lighting apparatus of FIG. 6, in a structure including: an ultraviolet LED of 380 nm as a light emitting element; and a Phosphor dispersion resin layer covered on the ultraviolet LED, the resin layer being provided by dispersing, in a layer of resin, the phosphor of Example 1 of the present invention, a blue-aimed phosphor ($BaMgAl_{10}O_{17}$:Eu), and a green-aimed phosphor ($BaMgAl_{10}O_{17}$:Eu, Mn). Flowing an electric current through electroconductive terminals of the LED caused it to emit light at 380 nm, which excited the red-aimed phosphor, green-aimed phosphor, and blue-aimed phosphor to cause them to emit red light, green light, and blue light, respectively. This clarified that the structure was capable of functioning as a lighting instrument for emitting white light mixedly including these light.

There will be now explained an exemplary design of an image displaying apparatus adopting the phosphor of the present invention.

Example 45

Figure 9:
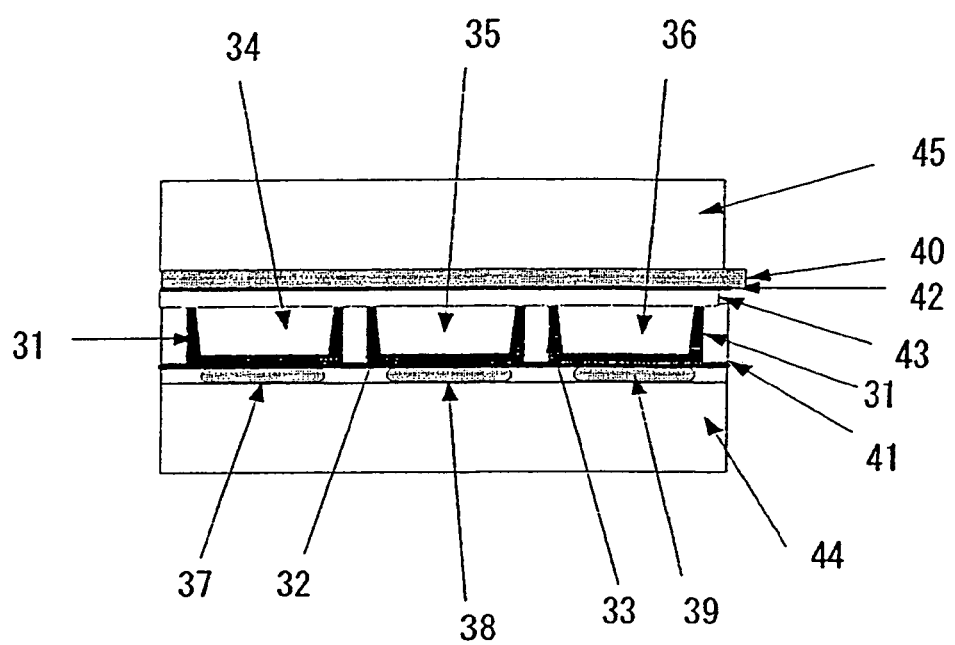
FIG. 9 is a schematic view of an image displaying apparatus (plasma display panel) according to the present invention.

FIG. 9 is a principle schematic view of a plasma display panel as an image displaying apparatus. The apparatus includes cells 34, 35, and 36 having inner surfaces coated with the red-aimed phosphor of Example 1 of the present invention, a green-aimed phosphor ($Zn_2SiO_4$:Mn) and a blue-aimed phosphor ($BaMgAl_{10}O_{17}$:Eu), respectively. It has been clarified that flow of electric current through electrodes 37, 38, 39, and 40 generates vacuum ultraviolet light by Xe discharge within the cells, to thereby excite the phosphors in a manner to emit visible light of red, green, and blue, respectively, so that these light are observed from the exterior through a protection layer 43, a dielectric layer 42, and a glass substrate 45, and thus the panel is capable of functioning as an image displaying apparatus.

INDUSTRIAL APPLICABILITY

The nitride phosphors of the present invention exhibit emission at longer wavelengths than those by conventional sialon phosphors and oxynitride phosphors, are excellent as red-aimed phosphors, and are less in luminance deterioration even upon exposure to excitation sources, thereby serving as nitride phosphors preferably usable for VFD, FED, PDP, CRT, white LED, and the like. Thus, the nitride phosphors of the present invention can be expected to be utilized to a great extent in material design of various display devices, thereby contributing to development of the industry.

The invention claimed is:

1. A phosphor, wherein the phosphor includes, as a main component, an inorganic compound comprising:

a composition on a pseudo-ternary phase diagram including AO (A is one kind or two or more kinds of metallic element(s) selected from Mg, Ca, Sr, and Ba; and AO is oxide of A), $Si_3N_4$, and $SiO_2$ as end members, respectively, and satisfying all of the following conditions:

in a composition formula, $pAO\text{-}qSi_3N_4\text{-}rSiO_2$ (p+q+r=1), $$0.1 \leq p \leq 0.95 \qquad (1),$$

$$0.05 \leq q \leq 0.9 \qquad (2), \text{ and}$$

$$0 \leq r \leq 0.5 \qquad (3), \text{ and}$$

at least a metallic element M (M is one kind or two or more kinds of element(s) selected from Mn, Ce, Nd, Sm, Eu, Tb, Dy, Ho, Er, Tm, and Yb) dissolved, in a solid state, in the composition.

2. The phosphor of claim 1, wherein the inorganic compound includes the metallic element M, the metallic element A, Si, oxygen, and nitrogen; and that the ratio among the elements M, A, Si, O, and N is represented by a composition formula $M_aA_bSi_cO_dN_e$ (a+b+c+d+e=1) which satisfies all of the following conditional equations (4) through (8):

$$0.00001 \leq a \leq 0.03 \quad (4),$$

$$d=(a+b) \times f \quad (5),$$

$$e=((4/3) \times c) \times g \quad (6),$$

$$0.8 \leq f \leq 1.25 \quad (7), \text{ and}$$

$$0.8 \leq g \leq 1.25 \quad (8);$$

or all of the following conditional equations (9) through (13):

$$0.00001 \leq a \leq 0.03 \quad (9),$$

$$d=(a+b+(1/2) \times c) \times f \quad (10),$$

$$e=c \times g \quad (11),$$

$$0.8 \leq f \leq 1.25 \quad (12), \text{ and}$$

$$0.8 \leq g \leq 1.25 \quad (13).$$

3. The phosphor of claim 2, wherein f=1 and g=1.

4. The phosphor of claim 2, wherein c≦3b when the inorganic compound satisfies the conditional equations (4) through (8), and c≦b when the inorganic compound satisfies the conditional equations (9) through (13).

5. The phosphor of claim 1, wherein the composition is a crystal represented by a composition formula $hSi_3N_4+iAO$ ("h" and "i" are between 0 inclusive and 1 inclusive, and 0.2≦i/(h+i)≦0.95), or a solid solution of the crystal.

6. The phosphor of claim 1, wherein the composition is an $A_2Si_3O_2N_4$ crystal, or a solid solution crystal thereof.

7. The phosphor of claim 6, wherein the solid solution crystal of $A_2Si_3O_2N_4$ is $A_2Si_{3-x}Al_xO_{2+x}N_{4-x}$ (0≦x≦0.5).

8. The phosphor of claim 1, wherein the composition is an $A_3Si_3O_3N_4$ crystal, or a solid solution crystal thereof.

9. The phosphor of claim 8, wherein the solid solution crystal of $A_3Si_3O_3N_4$ is $A_3Si_{3-x}Al_xO_{3+x}N_{4-x}$ (0≦x≦0.5).

10. The phosphor of claim 1, wherein the composition is a crystal represented by a composition formula $hSi_2N_2O+iAO$ ("h" and "i" are between 0 inclusive and 1 inclusive, and 0.2≦i/(h+i)≦0.9), or a solid solution of the crystal.

11. The phosphor of claim 1, wherein the composition is an $A_3Si_2O_4N_2$ crystal, or a solid solution crystal thereof.

12. The phosphor of claim 11, wherein the solid solution crystal of $A_3Si_2O_4N_2$ is $A_3Si_{2-x}Al_xO_{4+x}N_{2-x}$ (0≦x≦0.5).

13. The phosphor of claim 1, wherein the composition is an $A_3Si_{3-y}O_{3+y}N_{4-2y}$ crystal (0≦y≦1.8), or a solid solution crystal thereof.

14. The phosphor of claim 1, wherein the metallic element M is Eu and the metallic element A is Sr.

15. The phosphor of claim 1, wherein the metallic element A is a mixture of Ca and Sr, or a mixture of Ba and Sr.

16. The phosphor of claim 1, wherein the phosphor further includes an additional crystal phase or amorphous phase in addition to the inorganic compound; and that the inorganic compound is included at a content of 10 mass % or more.

17. The phosphor of claim 16, wherein the additional crystal phase or amorphous phase is an inorganic substance having electroconductivity.

18. A production method of the phosphor of claim 1, wherein the method comprises the step of:

firing a starting material mixture in a nitrogen atmosphere at a temperature range between 1,200° C. inclusive and 2,200° C. inclusive, wherein the starting material mixture is a mixture of metallic compounds, and is capable of constituting a composition comprising M, A, Si, O, and N, and including Al as required (M is one kind or two or more kinds of element(s) selected from Mn, Ce, Nd, Sm, Eu, Tb, Dy, Ho, Er, Tm, and Yb; and A is one kind or two or more kinds of element(s) selected from Mg, Ca, Sr, and Ba).

19. A lighting instrument constituted of at least a light-emitting source and a phosphor, wherein the constituent phosphor includes the phosphor of claim 1.

20. An image displaying apparatus constituted of at least an excitation source and a phosphor, wherein the constituent phosphor includes the phosphor of claim 1.

* * * * *